(12) United States Patent
Liang et al.

(10) Patent No.: US 8,679,893 B2
(45) Date of Patent: Mar. 25, 2014

(54) ABSORBERS FOR HIGH-EFFICIENCY THIN-FILM PV

(75) Inventors: Haifan Liang, Fremont, CA (US); Jeroen Van Duren, Palo Alto, CA (US)

(73) Assignee: Intermolecular, Inc., San Jose, CA (US)

( * ) Notice: Subject to any disclaimer, the term of this patent is extended or adjusted under 35 U.S.C. 154(b) by 15 days.

(21) Appl. No.: 13/596,439

(22) Filed: Aug. 28, 2012

(65) Prior Publication Data

US 2013/0164886 A1   Jun. 27, 2013

Related U.S. Application Data

(63) Continuation-in-part of application No. 13/595,888, filed on Aug. 27, 2012.

(60) Provisional application No. 61/578,691, filed on Dec. 21, 2011.

(51) Int. Cl.
    *H01L 21/00*   (2006.01)

(52) U.S. Cl.
    USPC .............................................. 438/95; 438/93

(58) Field of Classification Search
    USPC ...................................................... 438/93, 95
    See application file for complete search history.

(56) References Cited

U.S. PATENT DOCUMENTS

| | | | | |
|---|---|---|---|---|
| 6,429,369 B1 * | 8/2002 | Tober et al. | .................... | 136/265 |
| 6,518,086 B2 * | 2/2003 | Beck et al. | ...................... | 438/95 |

\* cited by examiner

*Primary Examiner* — Richard Booth

(57) ABSTRACT

Methods are described for forming CIGS absorber layers in TFPV devices with graded compositions and graded band gaps. Methods are described for utilizing Al to increase the band gap at the front surface of the absorber layer. Methods are described for forming a Cu—In—Ga layer followed by partial or full selenization. This results in a higher Ga concentration at the back interface. The substrate is then exposed to an aluminum CVD precursor while the substrate is still in the selenization equipment to deposit a thin Al layer. The substrate is then exposed to a Se source to fully convert the absorber layer. This results in a higher Al concentration at the front of the absorber.

7 Claims, 27 Drawing Sheets

| ID | Final Alloy | Precursor 1 | Precursor 2 | Grading Scheme | Main BSG Scheme | Main FSG Scheme |
|---|---|---|---|---|---|---|
| 1 | Cu(In,Ga)Se | Cu(In,Ga) | n/a | Back (BSG) | GGI | None |
| 2 | Cu(In,Al)Se | Cu(In,Al) | n/a | Back (BSG) | AIA | None |
| 3 | Cu(In,Ga)(S,Se) | Cu(In,Ga) | n/a | Double (DSG) | GGI & SSS | SSS |
| 4 | (Ag,Cu)(In,Ga)Se | (Ag,Cu)(In,Ga) | n/a | Double (DSG) | GGI | GGI & ACA |
| 5 | Cu(In,Ga)Se | Cu(In,Ga) | n/a | Double (DSG) | GGI | GGI |
| 6 | (Ag,Cu)(In,Ga)(S,Se,Te) | (Ag,Cu)(In,Ga) | n/a | Double (DSG) | Various | Various |
| 7 | Cu(In,Ga)Se | Cu(In,Ga)(VIA) | Cu(In,Ga) | Double (DSG) | GGI | GGI |
| 8 | Cu(In,Ga)Se | Cu(In,Ga) | Cu(In,Ga) | Double (DSG) | GGI | GGI |
| 9 | (Ag,Cu)(In,Ga)Se | Cu(In,Ga) | (Ag,Cu)(In,Ga) | Double (DSG) | GGI | GGI & ACA |
| 10 | Cu(In,Ga,Al)Se | Cu(In,Ga) | Cu(In,Ga,Al) | Double (DSG) | GGI | IIIA-Based |
| 11 | Cu(In,Ga)Se | Cu(In,Ga)(Se) | n/a | Double (DSG) | GGI | GGI |
| 12 | Cu(In,Ga,Al)Se | Cu(In,Ga,Al)(Se) | n/a | Double (DSG) | GGI | AIA |
| 13 | (Ag,Cu)(In,Ga)Se | (Ag,Cu)(In,Ga)(Se) | n/a | Double (DSG) | GGI | GGI |
|  |  |  |  |  | GGI = Ga/(In+Ga) | ACA = Ag/(Cu+Ag) |
|  |  |  |  |  | AIA = Al/(In+Al) | SSS = S/(S+Se) |
|  |  |  |  |  | CGI = Cu/(In+Ga) |  |

FIG. 20

ABSORBERS FOR HIGH-EFFICIENCY THIN-FILM PV

CROSS-REFERENCE TO RELATED APPLICATIONS

This application is a Continuation-in-Part of U.S. patent application Ser. No. 13/595,888 filed on Aug. 27, 2012, which further claims priority to U.S. Provisional Patent Application Ser. No. 61/578,691 filed on Dec. 21, 2011, each of which are herein incorporated by reference for all purposes.

FIELD OF THE DISCLOSURE

This disclosure relates to thin film photovoltaic devices, and more particularly, to an absorber layer for a thin film photovoltaic device that has a graded bandgap, and methods of forming the same. More specifically, methods of developing absorbers for copper indium gallium (sulfide) selenide (CIG(S)Se, or CIGS) solar cells, and copper zinc tin (sulfide) selenide (CZT(S)Se, or CZTS) solar cells are discussed.

BACKGROUND OF THE DISCLOSURE

Solar cells are photovoltaic (PV) devices that convert light into electrical energy. Solar cells have been developed as clean, renewable energy sources to meet growing demand. Solar cells have been implemented in a wide number of commercial markets including residential rooftops, commercial rooftops, utility-scale PV projects, building integrated PV (BIPV), building applied PV (BAPV), PV in electronic devices, PV in clothing, etc. Currently, crystalline silicon solar cells (both mono-crystalline and multi-crystalline) are the dominant technologies in the market. Crystalline silicon (cSi) solar cells must use a thick substrate (>100 um) of silicon to absorb the sunlight since it has an indirect bandgap and low absorption coefficient. The use of a thick substrate also means that the crystalline silicon solar cells must use high quality material to provide long carrier lifetimes. Therefore, crystalline silicon solar cell technologies lead to increased costs. Thin film photovoltaic (TFPV) solar devices based on amorphous silicon (a-Si), CIGS, cadmium telluride (CdTe), copper zinc tin sulfide (CZTS), etc. provide an opportunity to increase the material utilization since only thin films (<10 um) are generally required. The thin film solar cells may be formed from amorphous, nanocrystalline, micromorph, micro-crystalline, polycrystalline, or mono-crystalline materials. TFPV devices may include a single absorber layer for converting light into electricity, or multiple absorber layers with tuned absorption spectra for converting light into electricity in a tandem configuration. The tandem configuration might be a two-terminal device, or a multi-terminal (e.g. four-terminal) device structure. The multi-terminal device structure might be comprised of one stack of layers on one substrate, or involve different stacks of layers on multiple stacked substrates.

TFPV devices provide an opportunity to reduce energy payback time, and reduce water usage for solar panel manufacturing. Typical CdTe and CZTS films have bandgaps of about 1.5 eV and therefore, are an ideal match for the AM1.5G solar spectrum to allow for high efficiencies. The absorption coefficient for CdTe is about $10^5$/cm and the absorption coefficient for CZTS is about $10^4$/cm. CIGS films have bandgaps in the range of 1.0 eV (CIS) to 1.65 eV (CGS) and are also efficient absorbers across the entire solar spectrum. The absorption coefficient for CIGS is also about $10^5$/cm. Among the thin film solar technologies, CIGS has demonstrated the best lab cell efficiency (over 20%) and the best large area module efficiency (>15%).

Two general classes of PV absorber films of special interest are formed as CIGS-type IB-IIIA-VIA multinary chalcogenide compounds from Groups IB, IIIA, and VIA of the periodic table or as CZTS-type multinary compounds from Groups IB-IVA-IIB-VIA of the periodic table. Group IB includes Cu, Ag, and Au. Group IIIA includes B, Al, Ga, In, and Tl. Group VIA includes O, S, Se, Te, and Po. Additionally, the IB-IIIA-VIA materials can be doped with dopants from Groups VIII, IIB, IVA, VA, and VIIA of the periodic table. Group VIII includes Fe, Ru, Os, Co, Rh, Ir, Ni, Pd, and Pt. Group IIB includes Zn, Cd, and Hg. Group IVA includes C, Si, Ge, Sn, and Pb. Group VA includes N, P, As, Sb, and Bi. Group VIIA includes F, Cl, Br, I, and At. Other potential absorber materials of interest include kesterites like CZTS, cuprous oxide, iron sulfide, tungsten sulfide, calcium nitride, zinc phosphide, barium silicide, etc.

TFPV devices can be fabricated at the cell level or the panel level, thus further decreasing the manufacturing costs. As used herein, the cell level is understood to mean an individual unit that can be combined with other units to form a module. The cells may be rigid or flexible. As used herein, the panel level is understood to mean a large TFPV structure that is not composed of smaller units. Generally, the panels are similar in size to the aforementioned modules. For economy of language, the phrase "TFPV device" will be understood to refer to either a solar cell or a panel without distinction. Furthermore, TFPV devices may be fabricated on inexpensive substrates such as glass, plastics, and thin sheets of metal. Examples of suitable substrates comprise float glass, low-iron glass, borosilicate glass, flexible glass, flexible ceramics, specialty glass for high temperature processing, stainless steel, carbon steel, aluminum, cladded foils, copper, polyimide, plastics, etc. Furthermore, the substrates may be processed in many configurations such as single substrate processing, multiple substrate batch processing, inline continuous processing, roll-to-roll processing, etc.

The increasing demand for environmentally friendly, sustainable and renewable energy sources is driving the development of large area, thin film photovoltaic devices. With a long-term goal of providing a significant percentage of global energy demand, there is a concomitant need for Earth-abundant, high conversion efficiency materials for use in photovoltaic devices. A number of Earth abundant, direct-bandgap semiconductor materials now seem to show evidence of the potential for both high efficiency and low cost in Very Large Scale (VLS) production (e.g. greater than 100 gigawatt (GW)), yet their development and characterization remains difficult because of the complexity of the materials systems involved.

Among the TFPV technologies, CIGS and CdTe are the two that have reached volume production with greater than 11% stabilized module efficiencies. However, the supply of In, Ga and Te may impact annual production of CIGS and CdTe solar panels. Moreover, price increases and supply constraints in Ga and In could result from the aggregate demand for these materials used in flat panel displays (FPD) and light-emitting diodes (LED) along with CIGS TFPV. Also, there are concerns about the toxicity of Cd throughout the lifecycle of the CdTe TFPV solar modules. Efforts to develop devices that leverage manufacturing and R&D infrastructure related to these TFPV technologies but using more widely available and more environmentally friendly materials should be considered a top priority for research. The knowledge and infrastructure developed around CdTe and CIGS TFPV technologies can be leveraged to allow faster adoption of new TFPV materials systems.

The development of TFPV devices exploiting Earth abundant materials represents a daunting challenge in terms of the time-to-commercialization. That same development also suggests an enticing opportunity for breakthrough discoveries. A quaternary system such as CIGS requires management of multiple kinetic pathways, thermodynamic phase equilibrium considerations, defect chemistries, and interfacial control. The vast phase-space to be managed includes process parameters, source material choices, compositions, and overall integration schemes. The complexity of the intrinsically-doped, self-compensating, multinary, polycrystalline, queue-time-sensitive, thin-film absorber (CIGS), and its interfaces to up-, and down-stream processing, combined with the lack of knowledge on a device level to address efficiency losses effectively, makes it a highly empirical material system. The performance of any thin-film, (opto-)electronically-active device is extremely sensitive to its interfaces. Interface engineering for electronically-active devices is highly empirical. Traditional R&D methods are ill-equipped to address such complexity, and the traditionally slow pace of R&D could limit any new material from reaching industrial relevance when having to compete with the incrementally improving performance of already established TFPV fabrication lines, and continuously decreasing panel prices for more traditional cSi PV technologies.

Due to the complexity of the material, cell structure, and manufacturing process, both the fundamental scientific understanding and large scale manufacturability are yet to be realized for TFPV devices. As the photovoltaic industry pushes to achieve grid parity, much faster and broader investigation is needed to explore the material, device, and process windows for higher efficiency and a lower cost of manufacturing process. Efficient methods for forming different types of TFPV devices that can be evaluated are necessary.

In light of the above, there is a need in the art for an economical method of creating CIGS absorber layers having a graded band gap. A graded band gap allows for higher efficiency CIGS solar cells.

SUMMARY OF THE DISCLOSURE

In some embodiments, methods of forming CIGS absorber layers in a TFPV device with a graded bandgap with or without a graded gallium concentration are provided. In general, a gallium-containing alloy is formed on the light-receiving surface of a CIGS absorber layer and, in conjunction with a subsequent selenization or anneal process, is converted to a gallium-rich region at the front surface of the absorber layer.

In some embodiments, methods of forming absorber layers for a TFPV device include the steps of depositing a copper-indium-gallium layer on a substrate, forming an alloy on a first surface of the copper-indium-gallium layer that includes gallium (Ga) and selenium (Se), and performing a selenization process on the substrate that converts the gallium-containing alloy to a gallium-rich region at the first surface of the absorber, wherein forming the gallium-containing alloy on the first surface of the copper-indium-gallium layer includes maintaining the substrate at a temperature lower than a temperature at which the selenium-containing gas reacts with the copper-indium-gallium layer.

In some embodiments, methods of forming absorber layers for a TFPV device include the steps of depositing a Cu—In—Ga layer on a substrate, exposing the copper-indium-gallium layer to a source of Se to convert at least a portion of the Cu—In—Ga layer to a chalcogenide. In the same system, exposing the substrate to an aluminum CVD precursor to deposit a thin film of Al on the substrate. Exposing the substrate to a source of Se to convert all of the layers to a chalcogenide.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which:

FIG. 20 sets forth a table summarizing various methods used to produce a graded bandgap (single or double), according to embodiments of the invention.

DETAILED DESCRIPTION

Figure 1:
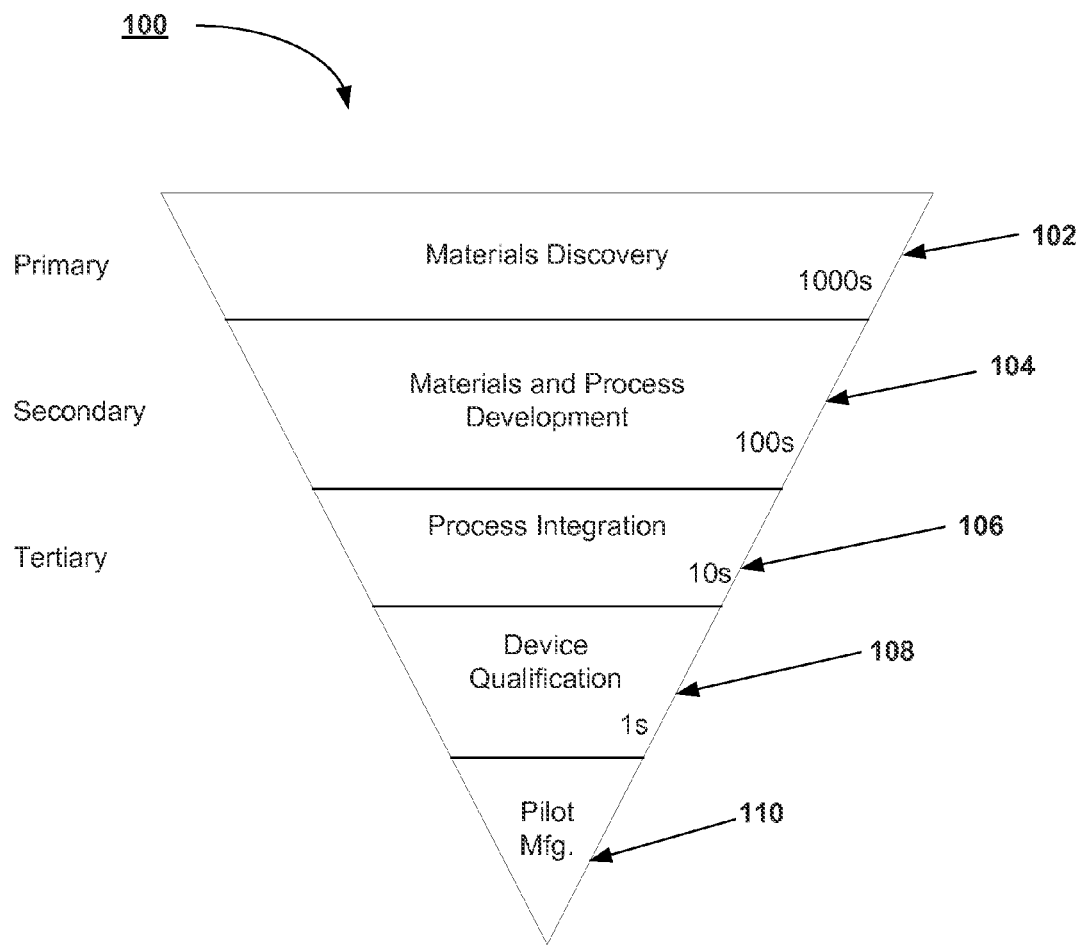
FIG. 1 is a schematic diagram for implementing combinatorial processing and evaluation.

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

As used herein, "CIGS" will be understood to represent the entire range of related alloys denoted by $Cu_zIn_{(1-x)}Ga_x S_{(2+w)(1-y)}Se_{(2+w)y}$, where $0.5 \leq z \leq 1.5$, $0 \leq x \leq 1$, $0 \leq y \leq 1$, $-0.2 \leq w \leq 0.5$. Similarly, as noted above, other materials (i.e. Ag, Au, Te, etc.) may be incorporated into potential absorber layers, (with e.g. Ag replacing part or all of the Cu, and Te replacing part or all of the Se and/or S). Also as mentioned previously, any of these materials may be further doped with a suitable dopant. As used herein, "CIGSSe", "CIGSe", and "CIGS" will be defined as equivalent and will be used interchangeably and will include all compositions including Cu—In—Ga—Se—S, Cu—In—Ga—Se, and Cu—In—Ga—S. Furthermore, "CIGS" also includes other IB-IIIA-VIA alloys, like (Ag,Cu)(In,Ga)(Se), or (Cu)(In,Ga)(S,Se,Te), and the like.

As used herein, "CZTS" will be understood to represent the entire range of related alloys denoted by $Cu_zZn_wSn_x(S_y Se_{1-y})_4$ where $0 \leq y \leq 1$ and w, x, and z range from 0 to 2. Similarly, as noted above, other materials (i.e. Ag, Au, Cd, Ge, Te, etc.) may be incorporated into potential absorber layers, (with e.g. Ag replacing part or all of the Cu, and Te replacing part or all of the Se and/or S). Also as mentioned previously, any of these materials may be further doped with a suitable dopant. As used herein, "CZTSSe", "CZTSe", and "CZTS" will be defined as equivalent and will be used interchangeably and will include all compositions including Cu—Zn—Sn—Se—S, Cu—Zn—Sn—Se, and Cu—Zn—Sn—S. Furthermore, "CZTS" also includes other IB-IIB-IVA-VIA alloys, like (Ag,Cu)(Zn,Cd)(Sn,Ge)(Se,S), and the like.

As used herein, the notation "(IIIA)" will be understood to represent the sum of the concentrations of all Group-IIIA elements. This notation will be used herein in calculations of the composition ratios of various elements. This notation will be understood to extend to each of the other Groups of the periodic table respectively (e.g. "(IA)", "(IIA)", "(IVA)", "(VIA)", "(IB)", "(IIB)", etc.).

As used herein, the notation "Cu—In—Ga" will be understood to include a material containing these elements in any ratio. The notation is extendable to other materials and other elemental combinations.

As used herein, the notation "$Cu_xIn_yGa_z$" and "Cu(In,Ga)" will be understood to include a material containing these elements in a specific ratio given by x, y, and z (e.g. $Cu_{75}Ga_{25}$ contains 75 atomic % Cu and 25 atomic % Ga). The notation is extendable to other materials and other elemental combinations.

As used herein, the notation "$(Ag,Cu)_x(In,Ga)_y(Se,S,Te)_z$" will be understood to include a material containing a total amount of Group-IB elements (i.e. Ag plus Cu, etc.) in a ratio given by "x", a total amount of Group-IIIA elements (i.e. In plus Ga), etc. in a ratio given by "y", and a total amount of Group-VIA elements (i.e. Se plus S plus Te, etc.) in a ratio given by "z". The notation is extendable to other materials and other elemental combinations.

As used herein, "metal chalcogenide" or "chalcogenide" will be understood to represent the entire range of related compounds denoted by "MX" where M represents one or more metal elements and X represents one or more of the chalcogen elements (e.g. O, S, Se, or Te).

As used herein, "chalcogenize" and "chalcogenization" will be understood to represent the process by which one or more metals are converted to chalcogenide compounds by exposing the one or more metals to a chalcogen (e.g. O, S, Se, or Te) at elevated temperature (e.g. between 100C and 700C). Specifically, "selenization" will be understood to represent the process by which one or more metals are converted to selenide compounds by exposing the one or more metals to a Se source at elevated temperature (e.g. between 100C and 700C). Specifically, "sulfurization" will be understood to represent the process by which one or more metals are converted to sulfide compounds by exposing the one or more metals to a S source at elevated temperature (e.g. between 100C and 700C). In addition, "chalcogenize" or "chalcogenization" will be understood to represent the process by which a metal precursor is either partially or completely converted to the final multinary chalcogenide compound(s). Similarly, "chalcogenize" or "chalcogenization" will be understood to represent the process by which a precursor containing one or more chalcogenide materials with/without one or more elemental or alloy metals is converted to one or more dense, polycrystalline, desired multinary chalcogenide compound(s). It should be understood that the majority of the final film contains the desired multinary chalcogenide compound(s), yet a minority of the material might not be converted to the desired multinary chalcogenide compound(s).

As used herein, the terms "film" and "layer" will be understood to represent a portion of a stack. They will be understood to cover both a single layer as well as a multilayered structure (i.e. a nanolaminate). As used herein, these terms will be used synonymously and will be considered equivalent.

As used herein, "single grading" and "single gradient" will be understood to describe cases wherein a parameter varies throughout the thickness of a film or layer and further exhibits a smooth, quasilinear variation. Examples of suitable parameters used herein will include the atomic concentration of a specific elemental species (i.e. composition variation) throughout the thickness of a film or layer, and bandgap energy variation throughout the thickness of a film or layer.

As used herein, "double grading" and "double gradient" will be understood to describe cases wherein a parameter varies throughout the thickness of a film or layer and further exhibits a variation wherein the value of the parameter is smaller toward the middle of the film or layer with respect to either end of the film or layer. It is not a requirement that the value of the parameter be equivalent at the two ends of the film or layer. Examples of suitable parameters used herein will include the atomic concentration of a specific elemental species (i.e. composition variation) throughout the thickness of a film or layer, and bandgap energy variation throughout the thickness of a film or layer.

As used herein, "substrate configuration" will be understood to describe cases wherein the TFPV stack is built sequentially on top of a substrate and the light is assumed to be incident upon the top of the TFPV stack. As used herein, an "n-substrate" configuration will be used to denote that the n-type layer (i.e. buffer layer) is closest to the incident light. The n-substrate configuration is the most common. As used herein, a "p-substrate" configuration will be used to denote that the p-type layer (i.e. absorber layer) is closest to the incident light.

As used herein, "supersubstrate configuration" will be understood to describe cases wherein the substrate faces the incident sunlight. The convention will be used wherein light is assumed to be incident upon the substrate. As used herein, a "n-superstrate" configuration will be used to denote that the n-type layer (i.e. buffer layer) is closest to the incident light. As used herein, a "p-superstrate" configuration will be used to denote that the p-type layer (i.e. absorber layer) is closest to the incident light.

As used herein, "substrate" will be understood to generally be one of float glass, low-iron glass, borosilicate glass, flexible glass, specialty glass for high temperature processing, stainless steel, carbon steel, aluminum, copper, titanium, molybdenum, polyimide, plastics, cladded metal foils, etc. Furthermore, the substrates may be processed in many configurations such as single substrate processing, multiple substrate batch processing, inline continuous processing, roll-to-roll processing, etc. in all of the methods and examples described herein.

As used herein, "precursor layer", "precursor material", "metal precursor layer", "metal precursor material", etc. will be understood to be equivalent and be understood to refer to a metal, metal alloy, metal chalcogenide, etc. layer and/or material that is first deposited and will ultimately become the absorber layer of the TFPV device after full chalcogenization and/or further processing.

As used herein, "absorber layer", "absorber material", etc. will be understood to be equivalent and be understood to refer to a layer and/or material that is responsible for the charge generation in the TFPV device after full chalcogenization and/or further processing.

As used herein, the notations "Al:ZnO" and "ZnO:Al" will be understood to be equivalent and will describe a material wherein the base material is the metal oxide and the element separated by the colon ":" is considered a dopant. In this example, Al in a dopant in a base material of zinc oxide. The notation is extendable to other materials and other elemental combinations.

As used herein, a "bandgap-increasing metal" will be understood to be a metal element that increases the bandgap when substituted for an element from the same periodic table Group in the absorber material. For example, substituting Ag for a portion of the Cu in a CIGS material will increase the bandgap. For example, increasing the relative amount of Ga versus indium in a CIGS material will increase the bandgap. For example, substituting Ag for a portion of the Cu in a CZTS material will increase the bandgap. For example, substituting Ge for a portion of the Sn in a CZTS material will increase the bandgap.

The bandgap value represents the energy difference between the top of the valence band and the bottom of the conduction band in the CIGS absorber layer. In FIGS. 6-9, 12, 14, 16, and 18, the bandgap diagrams are included to aid the reader in visualizing the relative magnitude of the bandgap across the absorber layer. No inferences should be made with respect to absolute values or actual changes in either the valance band or conduction band values. The diagrams are for visualization purposes only.

In various FIGs. below, a TFPV material stack is illustrated using a simple planar structure. Those skilled in the art will appreciate that the description and teachings to follow can be readily applied to any simple or complex TFPV solar cell structure, (e.g. a stack with (non-)conformal non-planar layers for optimized photon management). The drawings are for illustrative purposes only and do not limit the application of the present invention.

"Double grading" the bandgap of the CIGS absorber is a method known in the art to increase the efficiency of CIGS solar cells. In a CIGS absorber layer that has a double-graded bandgap profile, the bandgap of the CIGS layer increases toward the front surface and toward the back surface of the CIGS layer, with a bandgap minimum located in a center region of the CIGS layer. Double grading helps in reducing unwanted charge carrier recombination. The increasing bandgap profile at the back surface of the CIGS layer, (i.e., the absorber surface that is remote from the incident light in the substrate configuration), creates a back surface field, which reduces recombination at the back surface and enhances carrier collection. Generally, in the disclosure to follow, the description will applied to the "n-substrate" configuration for economy of language. However, those skilled in the art will understand that the disclosure is equally applicable to either of the "p-substrate" or "n, p-superstrate" configurations discussed previously and the disclosure will not be limited to only the "substrate configuration".

Co-evaporation is one technique known in the art for producing a double-graded bandgap in a CIGS absorber layer. The co-evaporation process can produce a "gallium (Ga) rich region" (i.e. increased Ga relative to the center region of the layer) at the front and/or back surfaces of a CIGS absorber layer and a gallium-poor region in the center of the CIGS absorber layer. However, co-evaporation is a relatively complex process that is not as economical or as easily implemented as other deposition processes known in the art. In a 2-step process, Cu—In—Ga metal precursors are deposited first, followed by a second selenization process to form a CIGS absorber layer. The 2-step process is generally more suited to large-scale low-cost manufacturing compared to the co-evaporation process. However, because gallium selenizes slower than indium under otherwise identical conditions, gallium tends to accumulate towards the back surface of the CIGS layer during the selenization process, thereby creating an uncontrolled single grading in the bandgap profile, i.e., the bandgap of the CIGS layer increases from the front surface to the back surface. Double grading of the bandgap profile is then typically achieved by the incorporation of sulfur (S) at the front surface of the CIGS layer for a 2-step process thereby creating CIGSSe. However, sulfur incorporation adds considerable complexity to the growth process and more easily produces a TFPV absorber material (copper-indium-gallium-selenium-sulfur) of lower quality compared to CIGSe without sulfur.

The efficiency of TFPV devices depends on many properties of the absorber layer and the buffer layer such as crystallinity, grain size, composition uniformity, density, defect concentration, doping level, surface roughness, etc.

The manufacture of TFPV devices entails the integration and sequencing of many unit processing steps. As an example, TFPV manufacturing typically includes a series of processing steps such as cleaning, surface preparation, deposition, patterning, etching, thermal annealing, and other related unit processing steps. The precise sequencing and integration of the unit processing steps enables the formation of functional devices meeting desired performance metrics such as efficiency, power production, and reliability.

As part of the discovery, optimization and qualification of each unit process, it is desirable to be able to i) test different materials, ii) test different processing conditions within each unit process module, iii) test different sequencing and integration of processing modules within an integrated processing tool, iv) test different sequencing of processing tools in executing different process sequence integration flows, and combinations thereof in the manufacture of devices such as TFPV devices. In particular, there is a need to be able to test i) more than one material, ii) more than one processing condition, iii) more than one sequence of processing conditions, iv) more than one process sequence integration flow, and combinations thereof, collectively known as "combinatorial process sequence integration", on a single substrate without the need of consuming the equivalent number of monolithic substrates per material(s), processing condition(s), sequence(s) of processing conditions, sequence(s) of processes, and combinations thereof. This can greatly improve both the speed and reduce the costs associated with the discovery, implementation, optimization, and qualification of material(s), process(es), and process integration sequence(s) required for manufacturing.

Systems and methods for High Productivity Combinatorial (HPC) processing are described in U.S. Pat. No. 7,544,574 filed on Feb. 10, 2006, U.S. Pat. No. 7,824,935 filed on Jul. 2, 2008, U.S. Pat. No. 7,871,928 filed on May 4, 2009, U.S. Pat. No. 7,902,063 filed on Feb. 10, 2006, and U.S. Pat. No. 7,947,531 filed on Aug. 28, 2009 which are all herein incorporated by reference. Systems and methods for HPC processing are further described in U.S. patent application Ser. No. 11/352,077 filed on Feb. 10, 2006, claiming priority from Oct. 15, 2005, U.S. patent application Ser. No. 11/419,174 filed on May 18, 2006, claiming priority from Oct. 15, 2005, U.S. patent application Ser. No. 11/674,132 filed on Feb. 12, 2007, claiming priority from Oct. 15, 2005, and U.S. patent application Ser. No. 11/674,137 filed on Feb. 12, 2007, claiming priority from Oct. 15, 2005 which are all herein incorporated by reference.

HPC processing techniques have been successfully adapted to wet chemical processing such as etching, texturing, polishing, cleaning, etc. HPC processing techniques have also been successfully adapted to deposition processes such as sputtering, atomic layer deposition (ALD), and chemical vapor deposition (CVD).

HPC processing techniques have been adapted to the development and investigation of absorber layers and buffer layers for TFPV solar cells as described in U.S. application Ser. No. 13/236,430 filed on Sep. 19, 2011, entitled "COMBINATORIAL METHODS FOR DEVELOPING SUPERSTRATE THIN FILM SOLAR CELLS" and is incorporated herein by reference. However, HPC processing techniques have not been successfully adapted to the development of contact structures for TFPV devices. Generally, there are two basic configurations for TFPV devices. The first configuration is known as a "substrate" configuration. In this configuration, the contact that is formed on or near the substrate is called the back contact. In this configuration, the light is incident on the TFPV device from the top of the material stack (i.e. the side opposite the substrate). CIGS and CZTS TFPV devices are most commonly manufactured in this configuration. The second configuration is known as a "superstrate" configuration. In this configuration, the contact that is formed on or near the substrate is called the front contact. In this configuration, the light is incident on the TFPV device through the substrate. CdTe, and a-Si, TFPV devices are most commonly manufactured in this configuration. In both configurations, light trapping schemes may be implemented in the contact layer that is formed on or near the substrate. Additionally, other efficiency or durability improvements can be implemented in the contact layer that is formed farthest away from the substrate.

FIG. 1 illustrates a schematic diagram, 100, for implementing combinatorial processing and evaluation using primary, secondary, and tertiary screening. The schematic diagram, 100, illustrates that the relative number of combinatorial processes run with a group of substrates decreases as certain materials and/or processes are selected. Generally, combinatorial processing includes performing a large number of processes during a primary screen, selecting promising candidates from those processes, performing the selected processing during a secondary screen, selecting promising candidates from the secondary screen for a tertiary screen, and so on. In addition, feedback from later stages to earlier stages can be used to refine the success criteria and provide better screening results.

For example, thousands of materials are evaluated during a materials discovery stage, 102. Materials discovery stage, 102, is also known as a primary screening stage performed using primary screening techniques. Primary screening techniques may include dividing substrates into coupons and depositing materials using varied processes. The materials are then evaluated, and promising candidates are advanced to the secondary screen, or materials and process development stage, 104. Evaluation of the materials is performed using metrology tools such as electronic testers and imaging tools (i.e., microscopes).

The materials and process development stage, 104, may evaluate hundreds of materials (i.e., a magnitude smaller than the primary stage) and may focus on the processes used to deposit or develop those materials. Promising materials and processes are again selected, and advanced to the tertiary screen or process integration stage, 106, where tens of materials and/or processes and combinations are evaluated. The tertiary screen or process integration stage, 106, may focus on integrating the selected processes and materials with other processes and materials.

The most promising materials and processes from the tertiary screen are advanced to device qualification, 108. In device qualification, the materials and processes selected are evaluated for high volume manufacturing, which normally is conducted on full substrates within production tools, but need not be conducted in such a manner. The results are evaluated to determine the efficacy of the selected materials and processes. If successful, the use of the screened materials and processes can proceed to pilot manufacturing, 110.

The schematic diagram, 100, is an example of various techniques that may be used to evaluate and select materials and processes for the development of new materials and processes. The descriptions of primary, secondary, etc. screening and the various stages, 102-110, are arbitrary and the stages may overlap, occur out of sequence, be described and be performed in many other ways.

This application benefits from High Productivity Combinatorial (HPC) techniques described in U.S. patent application Ser. No. 11/674,137 filed on Feb. 12, 2007 which is hereby incorporated for reference in its entirety. Portions of the '137 application have been reproduced below to enhance the understanding of the present invention. The embodiments described herein enable the application of combinatorial techniques to process sequence integration in order to arrive at a globally optimal sequence of TFPV manufacturing operations by considering interaction effects between the unit manufacturing operations, the process conditions used to effect such unit manufacturing operations, hardware details used during the processing, as well as materials characteristics of components utilized within the unit manufacturing operations. Rather than only considering a series of local optimums, i.e., where the best conditions and materials for each manufacturing unit operation is considered in isolation, the embodiments described below consider interactions effects introduced due to the multitude of processing operations that are performed and the order in which such multitude of processing operations are performed when fabricating a TFPV device. A global optimum sequence order is therefore derived and as part of this derivation, the unit processes, unit process parameters and materials used in the unit process operations of the optimum sequence order are also considered.

The embodiments described further analyze a portion or sub-set of the overall process sequence used to manufacture a TFPV device. Once the subset of the process sequence is identified for analysis, combinatorial process sequence integration testing is performed to optimize the materials, unit processes, hardware details, and process sequence used to build that portion of the device or structure. During the processing of some embodiments described herein, structures are formed on the processed substrate that are equivalent to the structures formed during actual production of the TFPV device. For example, such structures may include, but would not be limited to, contact layers, buffer layers, absorber layers, or any other series of layers or unit processes that create an intermediate structure found on TFPV devices. While the combinatorial processing varies certain materials, unit processes, hardware details, or process sequences, the composition or thickness of the layers or structures or the action of the unit process, such as cleaning, surface preparation, deposition, surface treatment, etc. is substantially uniform through each discrete region. Furthermore, while different materials or unit processes may be used for corresponding layers or steps in the formation of a structure in different regions of the substrate during the combinatorial processing, the application of each layer or use of a given unit process is substantially consistent or uniform throughout the different regions in which it is intentionally applied. Thus, the processing is uniform within a region (inter-region uniformity) and between regions (intra-region uniformity), as desired. It should be noted that the process can be varied between regions, for example, where a thickness of a layer is varied or a material may be varied between the regions, etc., as desired by the design of the experiment.

The result is a series of regions on the substrate that contain structures or unit process sequences that have been uniformly applied within that region and, as applicable, across different regions. This process uniformity allows comparison of the properties within and across the different regions such that the variations in test results are due to the varied parameter (e.g., materials, unit processes, unit process parameters, hardware details, or process sequences) and not the lack of process uniformity. In the embodiments described herein, the positions of the discrete regions on the substrate can be defined as needed, but are preferably systematized for ease of tooling and design of experimentation. In addition, the number, variants and location of structures within each region are designed to enable valid statistical analysis of the test results within each region and across regions to be performed.

Figure 2:
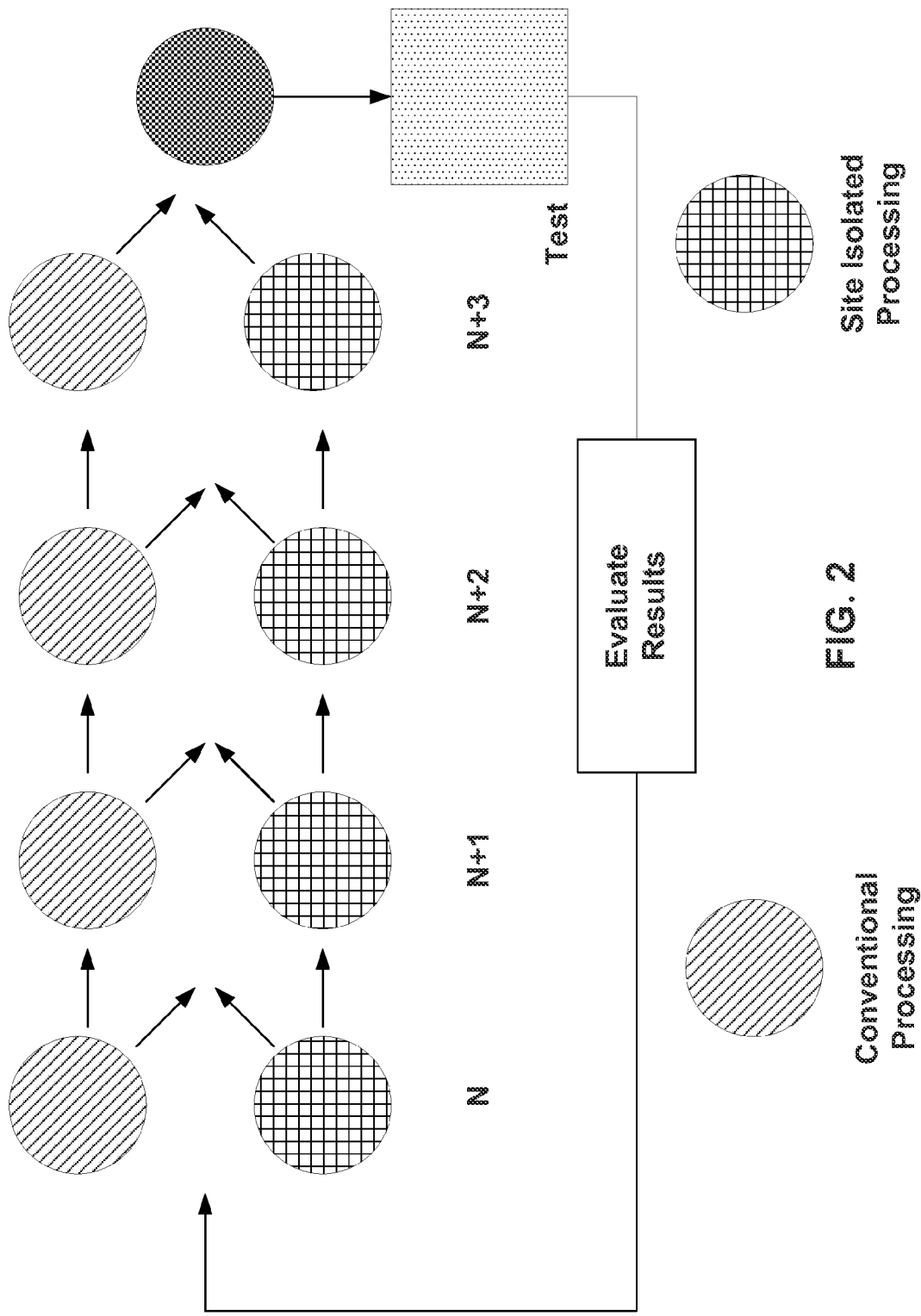
FIG. 2 is a schematic diagram for illustrating various process sequences using combinatorial processing and evaluation.

FIG. 2 is a simplified schematic diagram illustrating a general methodology for combinatorial process sequence integration that includes site isolated processing and/or conventional processing in accordance with one embodiment of the invention. In one embodiment, the substrate is initially processed using conventional process N. In one exemplary embodiment, the substrate is then processed using site isolated process N+1. During site isolated processing, an HPC module may be used, such as the HPC module described in U.S. patent application Ser. No. 11/352,077 filed on Feb. 10, 2006. The substrate can then be processed using site isolated process N+2, and thereafter processed using conventional process N+3. Testing is performed and the results are evaluated. The testing can include physical, chemical, acoustic, magnetic, electrical, optical, etc. tests. From this evaluation, a particular process from the various site isolated processes (e.g. from steps N+1 and N+2) may be selected and fixed so that additional combinatorial process sequence integration may be performed using site isolated processing for either process N or N+3. For example, a next process sequence can include processing the substrate using site isolated process N, conventional processing for processes N+1, N+2, and N+3, with testing performed thereafter.

It should be appreciated that various other combinations of conventional and combinatorial processes can be included in the processing sequence with regard to FIG. 2. That is, the combinatorial process sequence integration can be applied to any desired segments and/or portions of an overall process flow. The combinatorial processing may employ uniform processing of site isolated regions or may employ gradient techniques. Characterization, including physical, chemical, acoustic, magnetic, electrical, optical, etc. testing, can be performed after each process operation, and/or series of process operations within the process flow as desired. The feedback provided by the testing is used to select certain materials, processes, process conditions, and process sequences and eliminate others. Furthermore, the above flows can be applied to entire monolithic substrates, or portions of monolithic substrates such as coupons.

Under combinatorial processing operations the processing conditions at different regions can be controlled independently. Consequently, process material amounts, reactant species, processing temperatures, processing times, processing pressures, processing flow rates, processing powers, processing reagent compositions, the rates at which the reactions are quenched, deposition order of process materials, process sequence steps, hardware details, etc., can be varied from region to region on the substrate. Thus, for example, when exploring materials, a processing material delivered to a first and second region can be the same or different. If the processing material delivered to the first region is the same as the processing material delivered to the second region, this processing material can be offered to the first and second regions on the substrate at different concentrations. In addition, the material can be deposited under different processing parameters. Parameters which can be varied include, but are not limited to, process material amounts, reactant species, processing temperatures, processing times, processing pressures, processing flow rates, processing powers, processing reagent compositions, the rates at which the reactions are quenched, atmospheres in which the processes are conducted, an order in which materials are deposited, hardware details of the gas distribution assembly, etc. It should be appreciated that these process parameters are exemplary and not meant to be an exhaustive list as other process parameters commonly used in TFPV manufacturing may be varied.

As mentioned above, within a region, the process conditions are substantially uniform. That is, the embodiments, described herein locally perform the processing in a conventional manner, e.g., substantially consistent and substantially uniform, while globally over the substrate, the materials, processes, and process sequences may vary. Thus, the testing will find optimums without interference from process variation differences between processes that are meant to be the same. However, in some embodiments, the processing may result in a gradient within the regions. It should be appreciated that a region may be adjacent to another region in one embodiment or the regions may be isolated and, therefore, non-overlapping. When the regions are adjacent, there may be a slight overlap wherein the materials or precise process interactions are not known, however, a portion of the regions, normally at least 50% or more of the area, is uniform and all testing occurs within that region. Further, the potential overlap is only allowed with material of processes that will not adversely affect the result of the tests. Both types of regions are referred to herein as regions or discrete regions.

Figure 3:
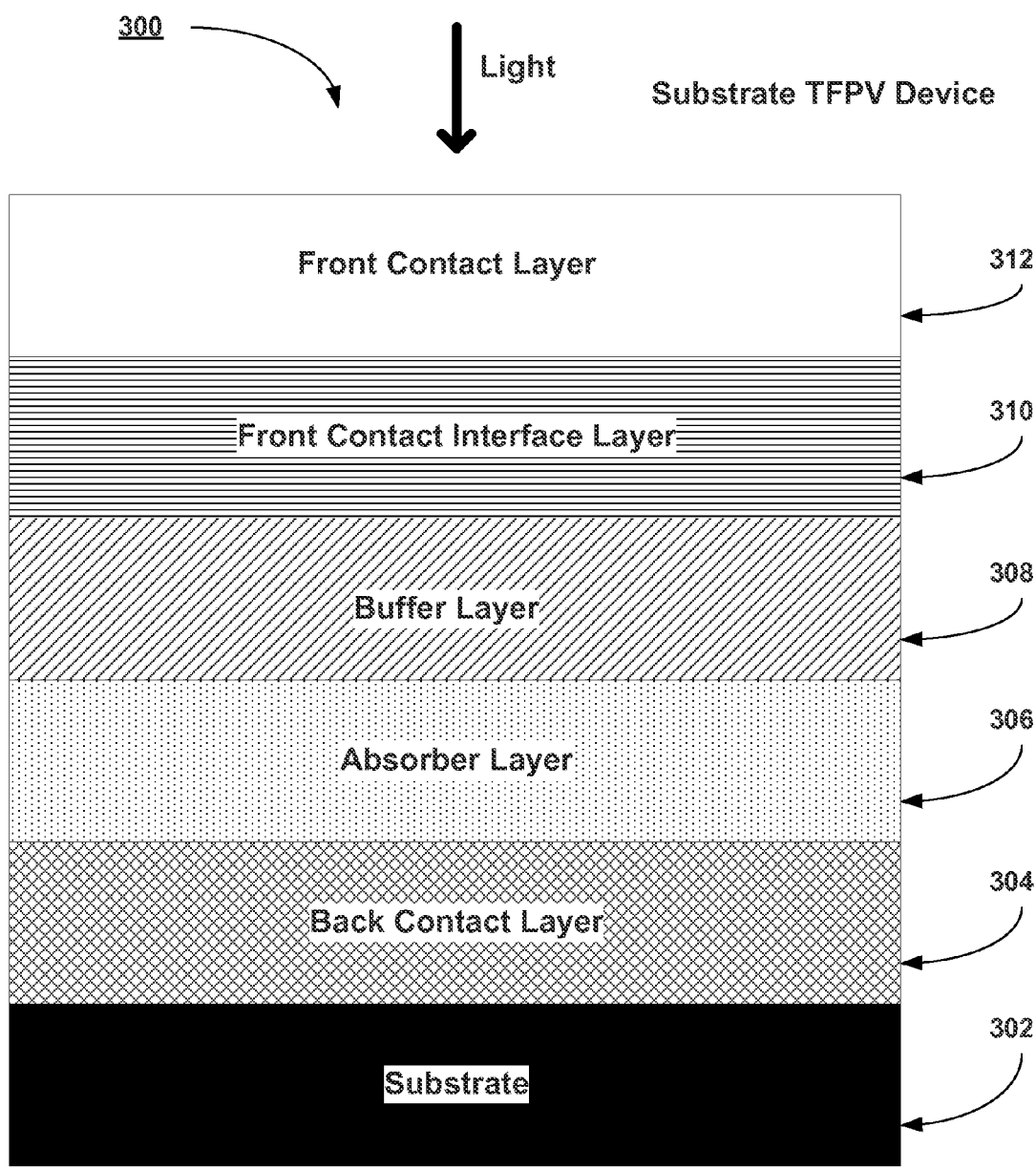
FIG. 3 illustrates a schematic diagram of a simple substrate TFPV stack according to an embodiment described herein.

FIG. 3 illustrates a schematic diagram of a simple TFPV device stack in the substrate configuration consistent with some embodiments of the present invention. The convention will be used wherein light is assumed to be incident upon the top of the material stack in the substrate configuration as illustrated. This generic diagram would be typical of either a CIGS TFPV device or a CZTS TFPV device. The difference being the choice of materials for the absorber layer. A back contact layer, 304, is formed on a substrate, 302. Examples of suitable substrates comprise float glass, low-iron glass, borosilicate glass, flexible glass, specialty glass for high temperature processing, stainless steel, carbon steel, aluminum, copper, titanium, molybdenum, polyimide, plastics, cladded metal foils, etc. Furthermore, the substrates may be processed in many configurations such as single substrate processing, multiple substrate batch processing, in-line continuous processing, in-line "stop and soak" processing, roll-to-roll processing, etc. As used herein, the phrase "back contact" will be understood to be the primary current conductor layer situated between the substrate and the absorber layer in a substrate configuration TFPV device. An example of a common back contact layer material is Mo for CIGS and CZTS. Other types of TFPV devices use different materials for the back contact. As an example, Cu alloys such as Cu/Au, Cu/graphite, Cu/Mo, Cu:ZnTe, etc. are typically used for CdTe TFPV devices and TCO materials such as ZnO, ITO, $SnO_2$:F, etc. are typically used for a-Si TFPV devices. The back contact layer may be formed by any number of deposition technologies. Examples of suitable deposition technologies comprise PVD (sputtering), evaporation, chemical vapor deposition (CVD), atomic layer deposition (ALD), plating, printing, wet coating, etc. The thickness of the back contact layer is typically between 0.3 um and 1.0 um. The back contact layer has a number of requirements such as high conductivity, good ohmic contact to the absorber layer, ease of bonding to tabs for external connectivity, ease of scribing or other removal, good thermo-mechanical stability, and chemical resistance during subsequent processing, among others.

Optionally, a diffusion barrier and/or adhesion-promotion layer (not shown) may be formed between the substrate and the back contact layer. When implemented, the diffusion barrier layer stops the diffusion of impurities from the substrate into the back contact layer, or alternatively, stops the diffusion and reaction of the back contact material with the substrate. Examples of common diffusion barrier and/or adhesion-promotion layers comprise chromium, vanadium, tungsten, nitrides such as tantalum nitride, tungsten nitride, titanium nitride, silicon nitride, zirconium nitride, hafnium nitride, oxy-nitrides such as tantalum oxy-nitride, tungsten oxy-nitride, titanium oxy-nitride, silicon oxy-nitride, zirconium oxy-nitride, hafnium oxy-nitride, oxides such as aluminum oxide, silicon oxide, carbides such as silicon carbide, binary and/or multinary compounds of tungsten, titanium, molybdenum, chromium, vanadium, tantalum, hafnium, zirconium, and/or niobium with/without the inclusion of nitrogen and/or oxygen. The diffusion barrier layer may be formed, partially or completely, from any well known technique such as sputtering, ALD, CVD, evaporation, wet methods such as printing or spraying of inks, screen printing, inkjet printing, slot die coating, gravure printing, wet chemical depositions, or from sol-gel methods such as the coating, drying, and firing of polysilazanes.

A p-type absorber layer, 306, of CIGS (CZTS or other material) is then deposited on top of the back contact layer. The absorber layer may be formed, partially or completely, using a variety of techniques such as PVD (sputtering), co-evaporation, in-line processing, plating, printing or spraying of inks, screen printing, inkjet printing, slot die coating, gravure printing, wet chemical depositions, CVD, etc. Advantageously, the absorber layer is deficient in Cu. The Cu deficiency may be controlled by managing the deposition conditions. Advantageously, a small amount of Na is contained in the absorber present during the absorber growth. The Na may be added by out-diffusion from the SLG substrate or may be purposely added in the form of $Na_2Se$ NaF, sodium alloys of In and/or Ga, or another Na source, prior, during, or after the deposition and/or growth of the absorber layer. Optionally, precursor and/or the absorber layer undergoes a selenization process after formation to convert the precursor to CIGS into a high-quality CIGS semiconductor film. The selenization process involves the exposure of the precursor and/or absorber layer to $H_2Se$, $H_2S$, Se vapor, S vapor, or diethylselenide (DESe) at temperatures most typically between 300C and 700C. It should be noted that the precursor to CIGS might already contain a chalcogen source (e.g. Se), either as a separate layer, or incorporated into the bulk of the precursor layer. The precursor film can be a stack of layers, or one layer. The precursor layer can be dense, or porous. The precursor film typically contains Cu, In, and Ga. The precursor layer is most commonly deposited by sputtering from e.g. binary copper-gallium and Indium sputter targets. Nevertheless, plating and printing to deposit the metal precursor film containing Cu, In, and/or Ga are used as well. During the selenization process, a layer of $Mo(S,Se)_2$ (not shown) forms at the back contact/absorber layer interface and forms a fairly good ohmic contact between the two layers. Alternatively, a layer of $Mo(S,Se)_2$ (not shown) can be deposited at the back contact/absorber layer interface using a variety of well known techniques such as PVD (sputtering), CBD, ALD, plating, etc. The thickness of the absorber layer is typically between 1.0 um and 3.0 um. The performance of the absorber layer is sensitive to materials properties such as crystallinity, grain size, surface roughness, composition, defect concentration, etc. as well as processing parameters such as temperature, deposition rate, thermal treatments, etc.

An n-type buffer layer, 308, is then deposited on top of the absorber layer. Examples of suitable n-type buffer layers comprise CdS, ZnS, $In_2S_3$, $In_2(S,Se)_3$, CdZnS, ZnO, Zn(O, S), (Zn,Mg)O, etc. CdS is the material most often used as the n-type buffer layer in CIGS or CZTS TFPV devices. The buffer layer may be deposited using chemical bath deposition (CBD), chemical surface deposition (CSD), PVD (sputtering), printing, plating, ALD, Ion-Layer-Gas-Reaction (IL-GAR), ultrasonic spraying, or evaporation. The thickness of the buffer layer is typically between 30 nm and 100 nm. The performance of the buffer layer is sensitive to materials properties such as crystallinity, grain size, surface roughness, composition, defect concentration, etc. as well as processing parameters such as temperature, deposition rate, thermal treatments, etc.

Optionally, an intrinsic ZnO (iZnO) layer, 310, is then formed on top of the buffer layer. The iZnO layer is a high resistivity material and forms part of the transparent conductive oxide (TCO) stack that serves as part of the front contact structure. The TCO stack is formed from transparent conductive metal oxide materials and collects charge across the face of the TFPV solar cell and conducts the charge to tabs used to connect the solar cell to external loads. The iZnO layer makes the TFPV solar cell less sensitive to lateral non-uniformities caused by differences in composition or defect concentration in the absorber and/or buffer layers. The iZnO layer is typically between about 0 nm and 150 nm in thickness. The iZnO layer is typically formed using a (reactive) PVD (sputtering) technique or CVD technique, but can be deposited by plating or printing as well. A low resistivity top TCO layer, 312, (examples include Al:ZnO (AZO), InSnO (ITO), InZnO, B:ZnO, Ga:ZnO, F:ZnO, F:SnO$_2$, etc.) is formed on top of the iZnO layer. The top TCO layer is typically between 0.25 um and 1.0 um in thickness. The top TCO layer is typically formed using a (reactive) PVD (sputtering) technique or CVD technique. Optionally, the transparent top electrode can be printed or wet-coated from (e.g. silver) nano-wires, carbon nanotubes, and the like.

Figure 4:
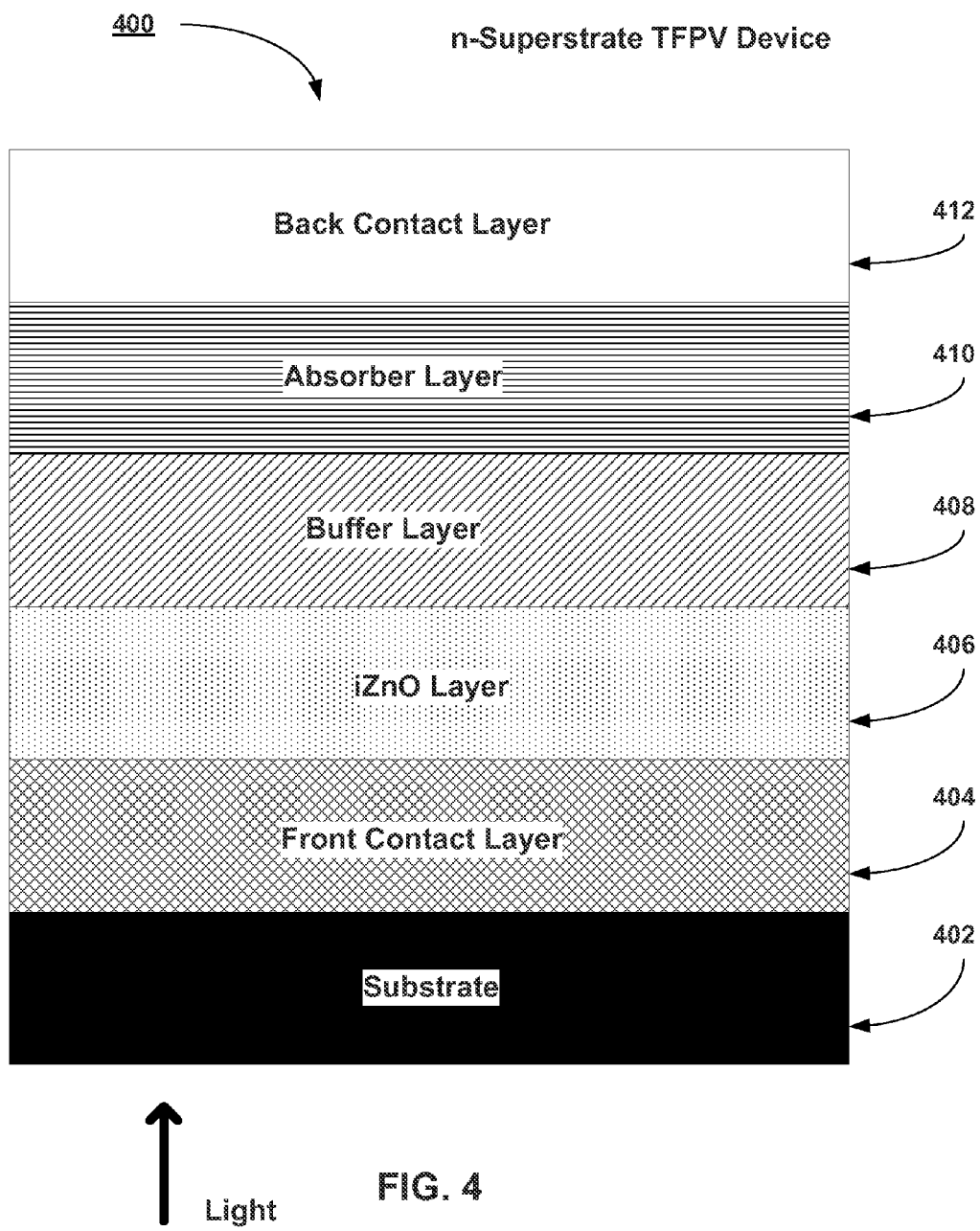
FIG. 4 illustrates a schematic diagram of a simple n-superstrate TFPV stack according to an embodiment described herein.

FIG. 4 illustrates a simple CIGS TFPV device material stack, 400, consistent with some embodiments of the present invention. The CIGS TFPV device illustrated in FIG. 4 is shown in a superstrate configuration wherein the glass substrate faces the incident sunlight. The convention will be used wherein light is assumed to be incident upon the substrate and material stack as illustrated. As used herein, this configuration will be labeled a "n-superstrate" configuration to denote that the n-type layer (i.e. buffer layer) is closest to the incident light. This label is to distinguish the configuration from an alternate configuration described with respect to FIG. 5 below. The formation of the CIGS TFPV device will be described starting with the substrate. A similar structure and similar method would also be applicable to the formation of a CZTS TFPV solar cell fabricated with a superstrate configuration. Examples of suitable substrates comprise float glass, low-iron glass, borosilicate glass, flexible glass, specialty glass for high temperature processing, polyimide, plastics, etc. Furthermore, the substrates may be processed in many configurations such as single substrate processing, multiple substrate batch processing, inline continuous processing, roll-to-roll processing, etc.

A low resistivity bottom TCO front contact layer, 404, (examples include Al:ZnO (AZO), InSnO (ITO), InZnO, B:ZnO, Ga:ZnO, F:ZnO, F:SnO$_2$, etc.) is formed on top of the substrate, 402. As used herein, the phrase "front contact" will be understood to be the primary current conductor layer situated between the substrate and the buffer layer in a superstrate configuration TFPV device. The bottom TCO layer is typically between 0.3 um and 2.0 um in thickness. The bottom TCO layer is typically formed using a reactive PVD (sputtering) technique or CVD technique.

Optionally, a diffusion barrier and/or adhesion-promotion layer (not shown) may be formed between the substrate, 402, and the front contact layer, 404. When implemented, the diffusion barrier layer stops the diffusion of impurities from the substrate into the TCO, or alternatively, stops the diffusion and reaction of the TCO material and above layers with the substrate. Examples of common diffusion barrier and/or adhesion-promotion layers comprise chromium, vanadium, tungsten, nitrides such as tantalum nitride, tungsten nitride, titanium nitride, silicon nitride, zirconium nitride, hafnium nitride, oxy-nitrides such as tantalum oxy-nitride, tungsten oxy-nitride, titanium oxy-nitride, silicon oxy-nitride, zirconium oxy-nitride, hafnium oxy-nitride, oxides such as aluminum oxide, silicon oxide, carbides such as silicon carbide, binary and/or multinary compounds of tungsten, titanium, molybdenum, chromium, vanadium, tantalum, hafnium, zirconium, and/or niobium with/without the inclusion of nitrogen and/or oxygen. It should be understood that the diffusion barrier layer composition and thickness are optimized for optical transparency as necessary for the superstrate configuration. The diffusion barrier layer may be formed from any well known technique such as sputtering, ALD, CVD, evaporation, wet methods such as printing or spraying of inks, screen printing, inkjet printing, slot die coating, gravure printing, wet chemical depositions, or from sol-gel methods, such as the coating, drying, and firing of polysilazanes.

An intrinsic iZnO layer, 406, is then formed on top of the TCO layer. The iZnO layer is a high resistivity material and forms part of the transparent conductive oxide (TCO) stack that serves as part of the front contact structure. The iZnO layer makes the TFPV device less sensitive to lateral non-uniformities caused by differences in composition or defect concentration in the absorber and/or buffer layers. The iZnO layer is typically between about 0 nm and 150 nm in thickness. The iZnO layer is typically formed using a reactive PVD (sputtering) technique or CVD technique.

An n-type buffer layer, 408, is then deposited on top of the iZnO layer, 406. Examples of suitable n-type buffer layers comprise CdS, ZnS, In$_2$S$_3$, In$_2$(S,Se)$_3$, CdZnS, ZnO, Zn(O, S), (Zn,Mg)O, etc. CdS is the material most often used as the n-type buffer layer in CIGS or CZTS TFPV devices. The buffer layer may be deposited using chemical bath deposition (CBD), chemical surface deposition (CSD), PVD (sputtering), printing, plating, ALD, Ion-Layer-Gas-Reaction (IL-GAR), ultrasonic spraying, or evaporation. The thickness of the buffer layer is typically between 30 nm and 100 nm. The performance of the buffer layer is sensitive to materials properties such as crystallinity, grain size, surface roughness, composition, defect concentration, etc. as well as processing parameters such as temperature, deposition rate, thermal treatments, etc.

A p-type absorber layer, 410, of CIGS (CZTS or other IB-IIIA-VIA material) is then deposited on top of the buffer layer. The absorber layer may be formed, partially or completely, using a variety of techniques such as PVD (sputtering), co-evaporation, in-line processing, plating, printing or spraying of inks, screen printing, inkjet printing, slot die coating, gravure printing, wet chemical depositions, CVD, etc. Advantageously, the absorber layer is deficient in Cu. The Cu deficiency may be controlled by managing the deposition conditions. Advantageously, a small amount of Na is present during the growth of the absorber. The Na may be purposely added in the form of Na$_2$Se or another Na source, prior, during, or after the deposition and/or growth of the absorber layer. Optionally, the precursor and/or absorber layer undergoes a selenization process after formation to convert the precursor to CIGS into a high-quality CIGS semiconductor film. The selenization process involves the exposure of the precursor and/or absorber layer to H$_2$Se, H$_2$S, Se vapor, S vapor, or diethylselenide (DESe) at temperatures most typically between 300C and 700C. It should be noted that the precursor to CIGS might already contain a chalcogen source (e.g. Se), either as a separate layer, or incorporated into the bulk of the precursor layer. The precursor film can be a stack of layers, or one layer. The precursor layer can be dense, or porous. The precursor film typically contains Cu, In, and Ga.

The precursor layer is most commonly deposited by sputtering from e.g. binary Cu—Ga and In sputter targets. Nevertheless, plating and printing to deposit the metal precursor film containing Cu, In, and/or Ga are used as well. During subsequent processing, a layer of $Mo(S,Se)_2$ (not shown) is formed at the back contact/absorber layer interface and forms a fairly good ohmic contact between the two layers. The thickness of the absorber layer is typically between 1.0 um and 3.0 um. The performance of the absorber layer is sensitive to materials properties such as crystallinity, grain size, surface roughness, composition, defect concentration, etc. as well as processing parameters such as temperature, deposition rate, thermal treatments, etc.

A back contact layer, 412, is formed on absorber layer, 410. An example of a common back contact layer material is Mo for CIGS and CZTS. The back contact layer may be formed by any number of deposition technologies. Examples of suitable deposition technologies comprise PVD (sputtering), evaporation, chemical vapor deposition (CVD), atomic layer deposition (ALD), plating, etc. The thickness of the back contact layer is typically between 0.3 um and 1.0 um. The back contact layer has a number of requirements such as high conductivity, good ohmic contact to the absorber layer, ease of bonding to tabs for external connectivity, ease of scribing or other removal, good thermo-mechanical stability, and chemical resistance during subsequent processing, among others. Other types of TFPV devices use different materials for the back contact. As an example, Cu alloys such as Cu/Au, Cu/graphite, Cu/Mo, Cu:ZnTe, etc. are typically used for CdTe TFPV devices and TCO materials such as ZnO, ITO, $SnO_2$:F, etc. are typically used for a-Si TFPV devices.

Figure 5:
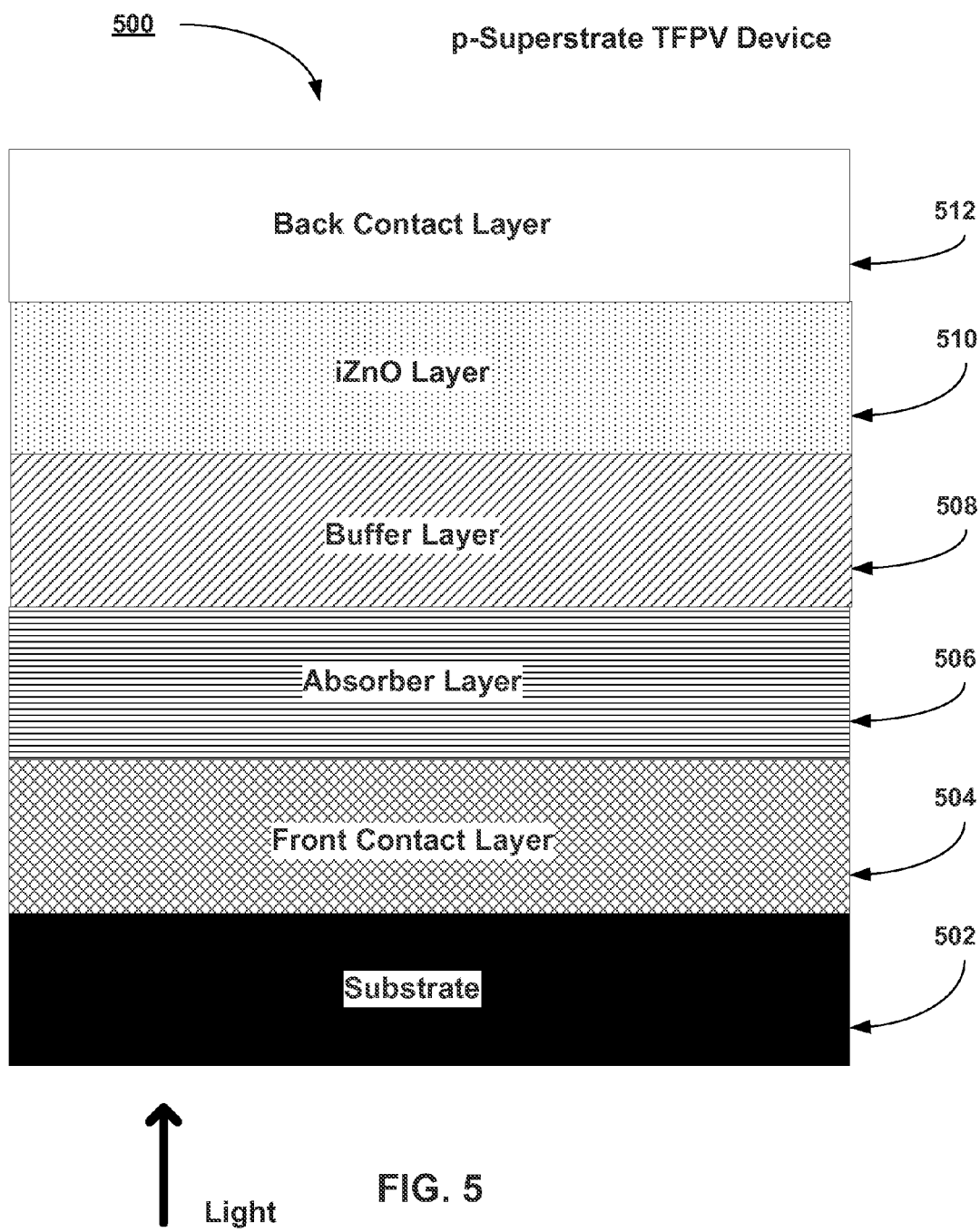
FIG. 5 illustrates a schematic diagram of a simple p-superstrate TFPV stack according to an embodiment described herein.

FIG. 5 illustrates a simple CIGS TFPV device material stack, 500, consistent with some embodiments of the present invention. The CIGS TFPV device illustrated in FIG. 5 is shown in a superstrate configuration wherein the glass substrate faces the incident sunlight. The convention will be used wherein light is assumed to be incident upon the substrate and material stack as illustrated. As used herein, this configuration will be labeled a "p-superstrate" configuration to denote that the p-type layer (i.e. absorber layer) is closest to the incident light. This label is to distinguish the configuration from the alternate configuration described with respect to FIG. 4 previously. The formation of the CIGS TFPV device will be described starting with the substrate. A similar structure and similar method would also be applicable to the formation of a CZTS TFPV solar cell fabricated with a superstrate configuration. Examples of suitable substrates comprise float glass, low-iron glass, borosilicate glass, flexible glass, specialty glass for high temperature processing, polyimide, plastics, etc. Furthermore, the substrates may be processed in many configurations such as single substrate processing, multiple substrate batch processing, inline continuous processing, roll-to-roll processing, etc.

A low resistivity bottom TCO front contact layer, 504, is formed on top of the substrate, 502. As used herein, the phrase "front contact" will be understood to be the primary current conductor layer situated between the substrate and the absorber layer in a superstrate configuration TFPV device. The bottom TCO layer is typically between 0.3 um and 2.0 um in thickness. The bottom TCO layer is typically formed using a reactive PVD (sputtering) technique or CVD technique. The TCO can be a p-type TCO, (e.g. ternary-based oxide in the family of $Co_3O_4$-based spinels, like $Co_2ZnO_4$ and $Co_2NiO_4$). Nevertheless, it should be understood that an n-type TCO with an additional layer (e.g. of $MoSe_2$) between the TCO and the absorber can be used as well. Furthermore, the TCO might be a bi- or multi-layer of an n-type TCO in contact with the substrate, followed by an ultrathin metal layer, (e.g. like Ag), followed by a thin p-type TCO in contact with the absorber layer, with/without an additional $MoSe_2$ layer between the p-type TCO and the absorber layer.

Optionally, a diffusion barrier and/or adhesion-promotion layer (not shown) may be formed between the substrate, 502, and the front contact layer, 504. When implemented, the diffusion barrier and/or adhesion-promotion layer stops the diffusion of impurities from the substrate into the TCO, or alternatively, stops the diffusion and reaction of the TCO material and above layers with the substrate. Examples of common diffusion barrier and/or adhesion-promotion layers comprise chromium, vanadium, tungsten, nitrides such as tantalum nitride, tungsten nitride, titanium nitride, silicon nitride, zirconium nitride, hafnium nitride, oxy-nitrides such as tantalum oxy-nitride, tungsten oxy-nitride, titanium oxy-nitride, silicon oxy-nitride, zirconium oxy-nitride, hafnium oxy-nitride, oxides such as aluminum oxide, silicon oxide, carbides such as silicon carbide, binary and/or multinary compounds of tungsten, titanium, molybdenum, chromium, vanadium, tantalum, hafnium, zirconium, and/or niobium with/without the inclusion of nitrogen and/or oxygen. It should be understood that the diffusion barrier and/or adhesion-promotion layer composition and thickness are optimized for optical transparency as necessary for the superstrate configuration. The diffusion barrier and/or adhesion-promotion layer may be formed from any well known technique such as sputtering, ALD, CVD, evaporation, wet methods such as printing or spraying of inks, screen printing, inkjet printing, slot die coating, gravure printing, wet chemical depositions, or from sol-gel methods such as the coating, drying, and firing of polysilazanes.

A p-type absorber layer, 506, of CIGS (CZTS or other absorber material) is then deposited on top of the front contact layer. The absorber layer may be formed, partially, or completely, using a variety of techniques such as PVD (sputtering), co-evaporation, in-line processing, plating, printing or spraying of inks, screen printing, inkjet printing, slot die coating, gravure printing, wet chemical depositions, CVD, etc. Advantageously, the absorber layer is deficient in Cu. The Cu deficiency may be controlled by managing the deposition conditions. Advantageously, a small amount of Na is present during the growth of the absorber. The Na may be purposely added in the form of $Na_2Se$ or another Na source, prior, during, or after the deposition of the precursor and/or absorber layer. Typically, the precursor and/or absorber layer undergoes a chalcogenization (e.g. selenization) process after formation to convert the precursor to CIGS into a high-quality CIGS semiconductor film. The chalcogenization process involves the exposure of the precursor and/or absorber layer to $H_2Se$, $H_2S$, Se vapor, S vapor, or diethylselenide (DESe) at temperatures most typically between 300C and 700C. It should be noted that the precursor to CIGS might already contain a chalcogen source (e.g. Se), either as a separate layer, or incorporated into the bulk of the precursor layer. The precursor film can be a stack of layers, or one layer. The precursor layer can be dense, or porous. The precursor film typically contains Cu, In, and Ga. The precursor layer is most commonly deposited by sputtering from e.g. binary copper-gallium and Indium sputter targets. Nevertheless, plating and printing to deposit the metal precursor film containing Cu, In, and/or Ga are used as well. The thickness of the absorber layer is typically between 1.0 um and 3.0 um. The performance of the absorber layer is sensitive to materials properties such as crystallinity, grain size, surface roughness, composition, defect concentration, etc. as well as processing parameters such as temperature, deposition rate, thermal treatments, etc.

An n-type buffer layer, 508, is then deposited on top of the absorber layer. Examples of suitable n-type buffer layers comprise CdS, ZnS, $In_2S_3$, $In_2(S,Se)_3$, CdZnS, ZnO, Zn(O, S), (Zn,Mg)O, etc. CdS is the material most often used as the n-type buffer layer in CIGS or CZTS TFPV devices. The buffer layer may be deposited using chemical bath deposition (CBD), chemical surface deposition (CSD), PVD (sputtering), printing, plating, ALD, Ion-Layer-Gas-Reaction (ILGAR), ultrasonic spraying, or evaporation. The thickness of the buffer layer is typically between 30 nm and 100 nm. The performance of the buffer layer is sensitive to materials properties such as crystallinity, grain size, surface roughness, composition, defect concentration, etc. as well as processing parameters such as temperature, deposition rate, thermal treatments, etc.

An intrinsic iZnO layer, 510, is then formed on top of the buffer layer. The iZnO layer is a high resistivity material and forms part of the back contact structure. The iZnO layer makes the TFPV device less sensitive to lateral non-uniformities caused by differences in composition or defect concentration in the absorber and/or buffer layers. The iZnO layer is typically between 0 nm and 150 nm in thickness. The iZnO layer is typically formed using a reactive PVD (sputtering) technique or CVD technique.

A back contact layer, 512, is formed on intrinsic iZnO layer, 510. An example of a suitable back contact layer material is a thin n-type TCO followed by Ni and/or Al. The back contact layer may be formed by any number of deposition technologies. Examples of suitable deposition technologies comprise PVD (sputtering), evaporation, chemical vapor deposition (CVD), atomic layer deposition (ALD), plating, etc. The thickness of the back contact layer is typically between 0.3 um and 1.0 um. The back contact layer has a number of requirements such as high conductivity, good ohmic contact to the absorber layer, ease of bonding to tabs for external connectivity, ease of scribing or other removal, good thermo-mechanical stability, and chemical resistance during subsequent processing, among others. Other types of TFPV devices use different materials for the back contact. As an example, Cu alloys such as Cu/Au, Cu/graphite, Cu/Mo, Cu:ZnTe, etc. are typically used for CdTe TFPV devices and TCO materials such as ZnO, ITO, $SnO_2$:F, etc. are typically used for a-Si TFPV devices.

The film stack described above is just one example of a film stack that can be used for TFPV devices. As an example, another substrate film stack (i.e. similar configuration as FIG. 3) might be: substrate/AZO/Mo/CIGS/CdS/iZnO/AZO. As an example, another p-superstrate film stack (i.e. similar configuration as FIG. 5) might be: substrate/barrier/ZnO:Al/Mo/CIGS/CdS/iZnO/ZnO:Al/Al. The detailed film stack configuration is not meant to be limiting, but simply serves as an example of the implementation of embodiments of the present invention.

The efficiency of a TFPV device depends on the bandgap of the absorber material. The goal is to have the bandgap tuned to the energy range of the photons incident on the device. The theoretical upper limit for a single p-n junction solar cell has been calculated to be about 33 to 34%. The peak in the efficiency occurs for values of the bandgap between 1.0 eV and 1.5 eV, and more specifically between 1.3 eV and 1.5 eV. The bandgap for CIGSe films varies smoothly from CISe=1.00 (i.e. Ga/(Ga+In)=0.0) to CGSe=1.68 (i.e. Ga/(Ga+In)=1.0). The region of interest is from Ga/(Ga+In)=0.4 (~1.23 eV) to Ga/(Ga+In)=0.7 (~1.45 eV).

Figure 6:
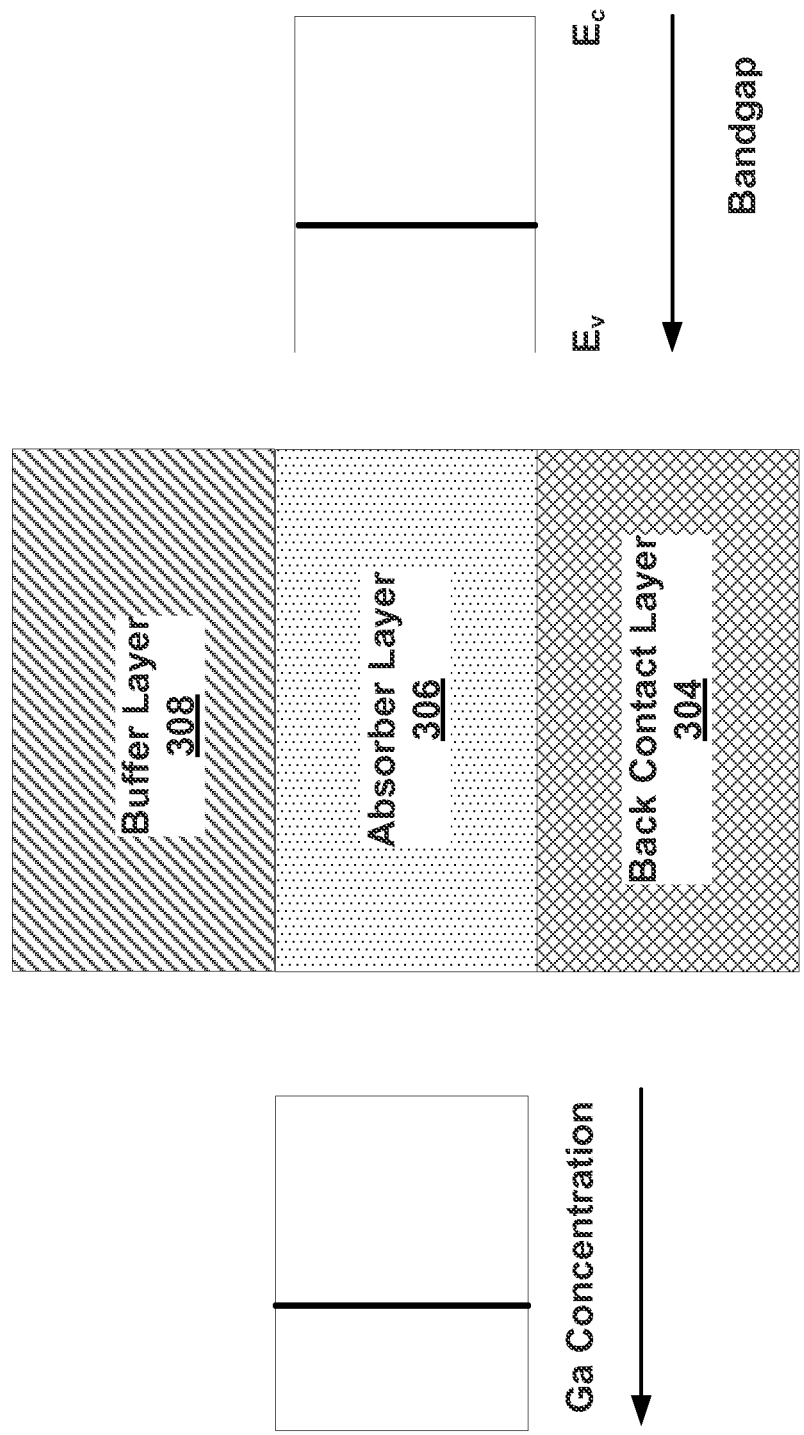
FIG. 6 illustrates an absorber layer having a flat Ga profile and a flat bandgap profile.
Figure 7:
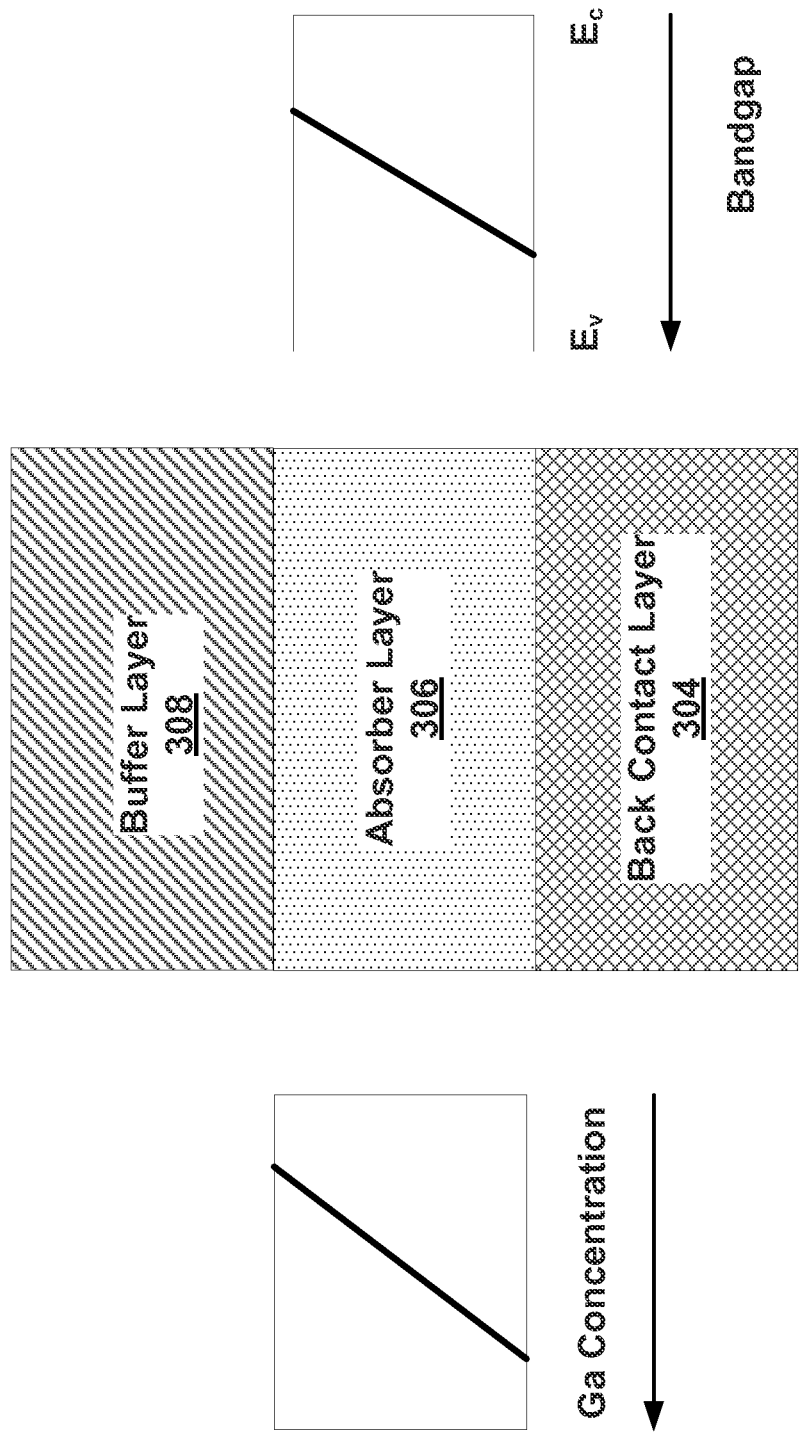
FIG. 7 illustrates an absorber layer having a single graded Ga profile and a single graded bandgap profile.
Figure 8:
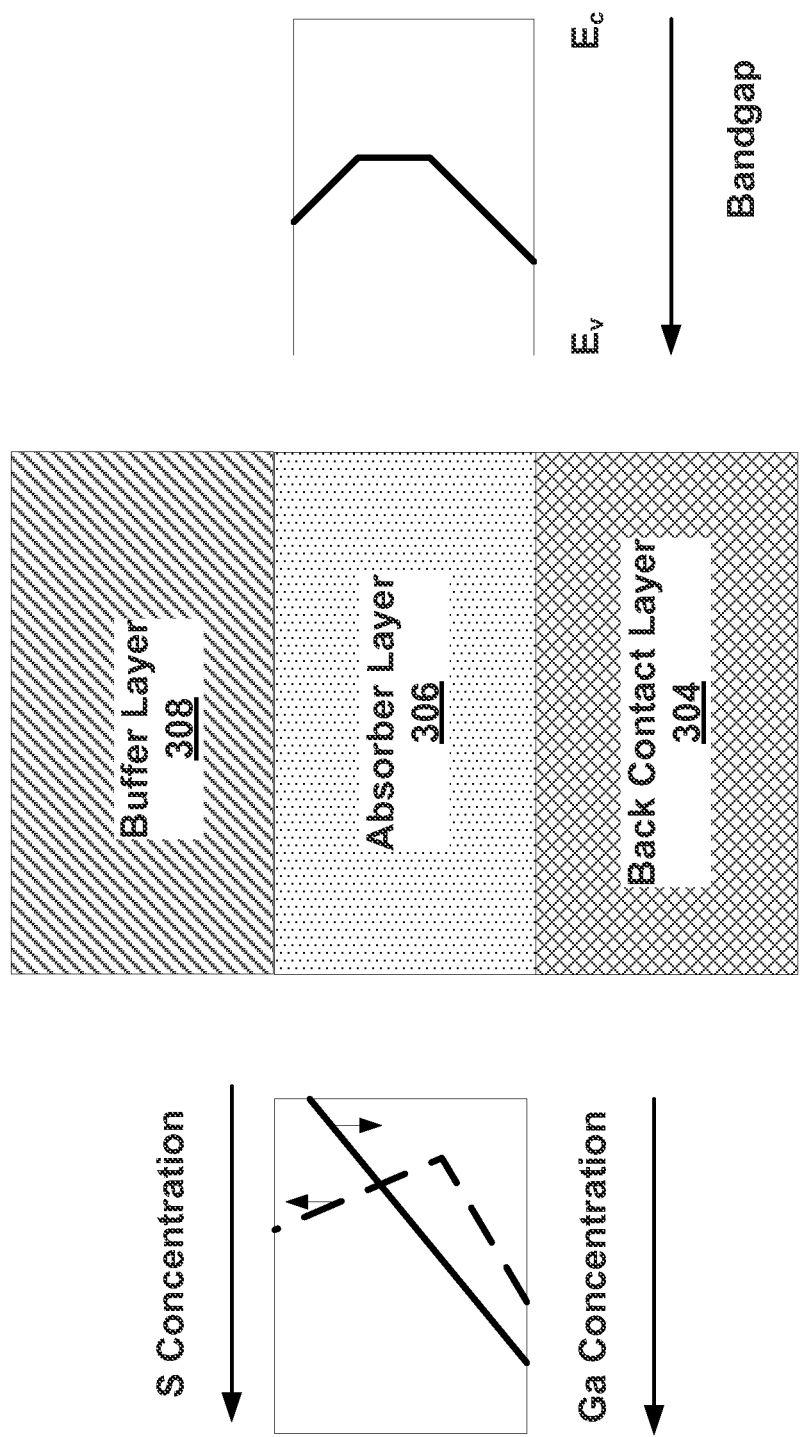
FIG. 8 illustrates an absorber layer having a single graded Ga profile, a double graded S profile, and a double graded bandgap profile.
Figure 9:
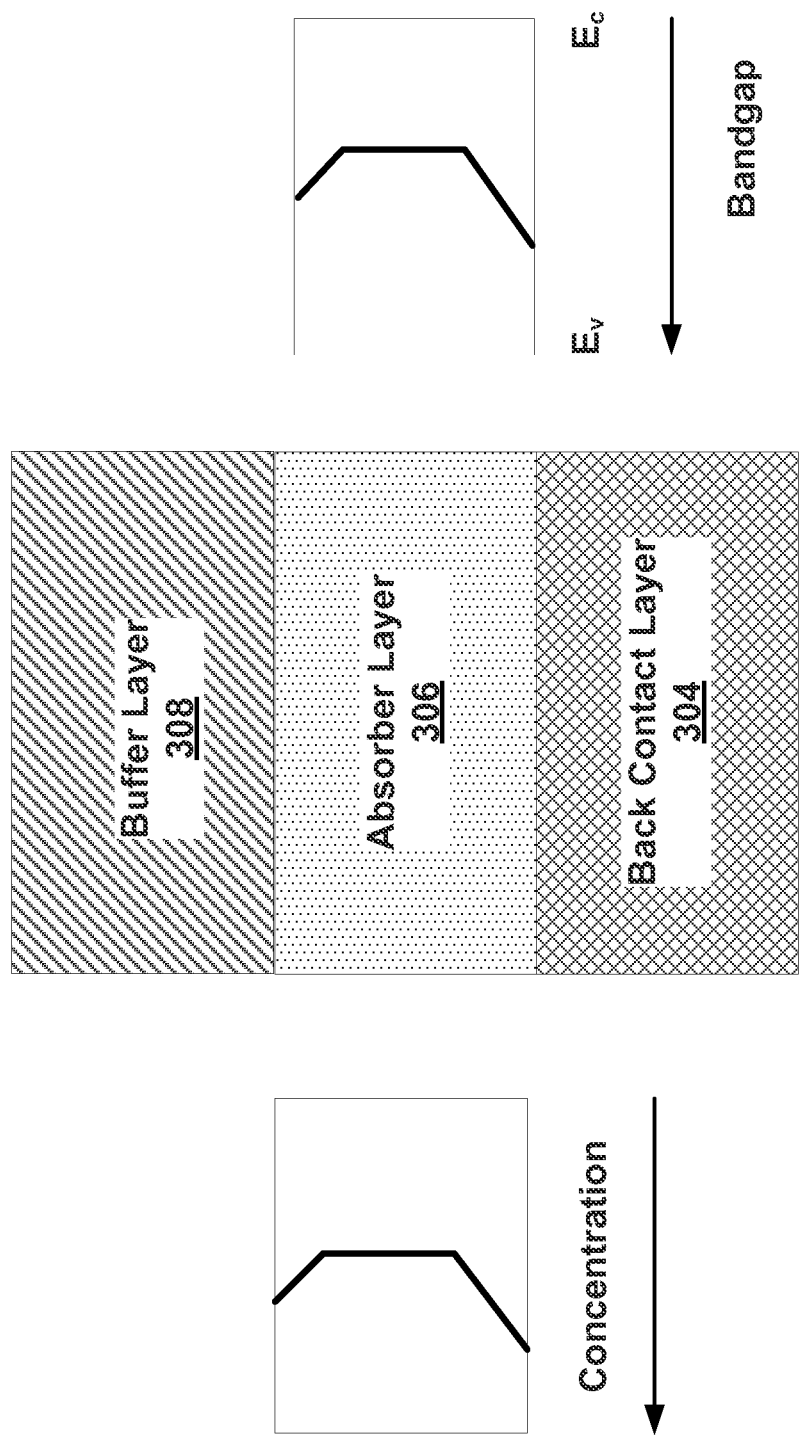
FIG. 9 illustrates an absorber layer having a double graded Ga profile and a double graded bandgap profile.

Group-IB-IIIA-VIA (e.g. CIGSe-based) TFPV devices can reach efficiencies beyond 15% without bandgap (Eg) grading (i.e. a flat Eg profile). A flat bandgap is illustrated in FIG. 6. Higher efficiencies have been obtained by single grading of CIGSe with a gradual drop in Ga/(In+Ga) from the back contact to the front, so without a "notch" (also called saddle, or double grading). A single graded bandgap is illustrated in FIG. 7. Forming CIGSe absorbers with a bandgap grading containing a "notch" (also called saddle profile or double grading) has allowed efficiencies above 18% to be realized. Bandgap grading via compositional grading, (most commonly done by Ga/(In+Ga), and/or S/(S+Se)) can produce efficiencies over 17%. A double graded bandgap using both Ga and S is illustrated in FIGS. 8 and 9. The efficiency for the double grading increased from 16%, via a few intermediate champions, to the current record of 20.3% by compositional grading Ga/(In+Ga) for CIGSe.

The improvements in efficiency for CIGSe TFPV devices over the past few decades can be divided into three categories:

First: Material quality improvement by reducing the electronically-active defects and optimizing doping profiles, thereby reducing recombination, and as such, improving open circuit voltage ($V_{oc}$) and the fill factor (FF).

Second: Bandgap (composition) depth profile improvements, thereby reducing recombination while maintaining photo-generation, and thereby obtaining both a high FF, a high $V_{oc}$ while maintaining the short circuit current density ($J_{sc}$).

Third: Improvements in junction partner, top electrode, cell design, grid design, and anti-reflection coatings, all contributing by reducing optical losses, and as such, improving $J_{sc}$.

It should be noted that in addition to CIGSe bulk improvements, like defect chemistry, the homogeneity of the absorber has improved tremendously, reducing the number of weak diodes in a CIGSe device. Furthermore, while improving the bulk of the layers, improved queue time control and interface engineering has resulted in reducing interface recombination, and assisted in improving FF and $V_{oc}$.

The 20% laboratory champions have been achieved by a long co-evaporation batch process which has proven difficult to transfer economically to the manufacturing floor, where High-Volume Manufacturing (HVM) requires an in-line process that is (i) fast (<5 min) using low-cost equipment, (ii) has high up-time, (iii) high yield, and (iv) high materials utilization to achieve a cost-competitive growth process. Unfortunately, in-line HVM processes have exhibited challenges in all of these metrics ((i)-(iv)), in addition to uniformity challenges on large area substrates.

Figure 10:
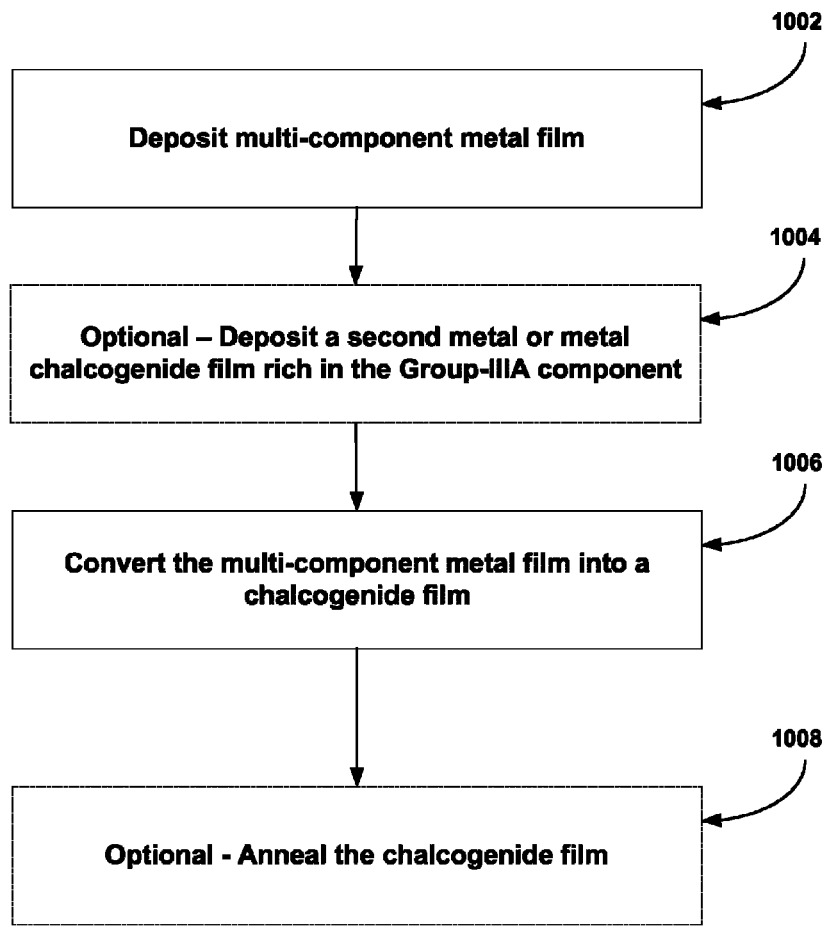
FIG. 10 provides a flow chart for a generic 2-step process.

One way of grading CIGS materials is by a 2-step approach as illustrated in FIG. 10. In step 1002, "metal precursor" films are deposited. For CIGS-like absorbers, the metal precursor films comprise Group IB and Group-IIIA metals. For CZTS-like absorbers, the metal precursor films comprise Group IB, Group-IIB, and Group-IVA metals. In the case of CIGS absorbers, the metal precursor films comprise Cu, In, and Ga, with/without a Na source. This metal film needs to be converted to a chalcogenide to form the absorber layer. The metal precursor film is converted to a chalcogenide by heating the film in the presence of a source of one or more the Group-VIA elements as indicated in step 1006.

Optionally, the chalcogenide film can be annealed as indicated in step 1008. For CIGS-type absorbers, a variation of the 2-step process comprises depositing a second, thin Group-IIIA film or Group-IIIA chalcogenide material (e.g. GaSe) on top of the metal precursor film as illustrated in step 1004. In this variation, the Group-IIIA metal is bound in the chalcogenide and its diffusion toward the back of the absorber layer is retarded, yielding a higher concentration of the Group-IIIA metal at the front of the absorber layer. This results in a double-graded composition of the Group-IIIA metal and a double-graded bandgap.

Generally, the 2-step method may comprise more than two steps when various wet chemical and/or conversion methods (e.g. for densification or contaminant removal) and/or deposition steps (e.g. for a separate chalcogen layer as discussed previously) are used to form the metal precursor film. As discussed above, the metal precursor film may be a single layer or may be formed from multiple layers, it may be dense or porous.

The highest efficiencies for 2-step CIG(S)Se have been achieved by converting PVD (sputtered) Cu(In,Ga) into CIG (S)Se by a chalcogenization process where the Cu(In,Ga) film is both chalcogenized and sulfurized. Unfortunately, CIG(S) Se formed using a 2-step process has not yet achieved >20% efficiency, and lags ~2% behind the laboratory champion of CIGSe. This is mainly due to the fact that it is challenging to control both bandgap grading and maintain a high minority carrier lifetime when sulfur is introduced.

Unfortunately, the traditional 2-step approach based on Cu(In,Ga) followed by selenization (without introducing sulfur) has so far only resulted in flat bandgap profiles, or single-graded CIGSe, resulting in efficiencies <16.0%.

It should be noted that the above cited efficiencies are laboratory champion efficiencies for 0.5 $cm^2$ solar cells, not to be confused with commercially available, average, solar panel efficiencies which are typically 5-6% lower than laboratory champions, due to a combination of non-uniformity within solar cells, mismatch between series-connected cells, absorption losses in thick TCO layers, encapsulant, and glass, scribe and edge losses, and additional series resistance, all in addition to running a different process in the factory compared to the laboratory.

One of the main challenges for 2-step selenization is to control the phase separation in the Cu-poor film. High efficiency CIG(S)Se requires a Cu-poor (p-type) CIGSe film. Cu-poor Cu(In,Ga) metal films prior to chalcogenization are multi-phasic (2 or more separate phases present in the film), and as such, are hard to deposit in a homogeneous fashion that provides a conformal, smooth, uniform Cu(In,Ga) film, especially, due to the fact that indium-rich phases have the tendency to agglomerate due to poor wetting of underlying surfaces. Laterally uniform Cu(In,Ga) and Cu(In,Ga)$Se_2$ films are needed to avoid the formation of weak diodes that reduce the overall solar cell efficiency.

The agglomeration of In is typically minimized by reducing the dynamic deposition rate, and/or controlling the substrate temperature during PVD, and/or introducing a multi-layer stack of alternating layers of In-rich and Cu-rich layers, all resulting in additional Capital Expenditure (CapEx). Other approaches try to avoid the phase separation by depositing a chalcogenide precursor film by PVD from binary, or multinary chalcogenide targets which results in a CapEx investment typically >3× higher than for PVD-CIG due to the deposition of a film ~3× thicker with a lower dynamic deposition rate. In addition, direct material costs for the chalcogenide targets are higher than for the metallic targets.

A second challenge for 2-step selenization is to control bandgap grading in depth in the final CIGSe film by Ga/(In+ Ga) compositional grading. Ga-rich phases chalcogenize slower than Cu and In, and therefore, most of the Ga collects at the back of the CIGSe film resulting in a single-graded CIGSe film. One way to avoid this Ga migration and maintain a flat Ga distribution is to extending the selenization time (>30 min), and go to high temperatures (550-600C). However, these temperatures are not compatible with all low-temperature, low-cost substrates. Furthermore, this has not resulted in any double-graded CIGSe (>20%).

A third challenge for 2-step selenization is to prevent adhesion failure of the CIGSe film due to stress resulting from the expansion from Cu(In,Ga) to CIGSe at elevated temperature. The expansion from the metal film to the chalcogenide film can be 2.5-3.0× in volume. Additionally, the overall stack of layers may have very different coefficients of thermal expansion, thickness, and Young's modulus.

So far, back grading has been done by compositional grading of Gallium (Ga/(In+Ga)).

Figure 11:
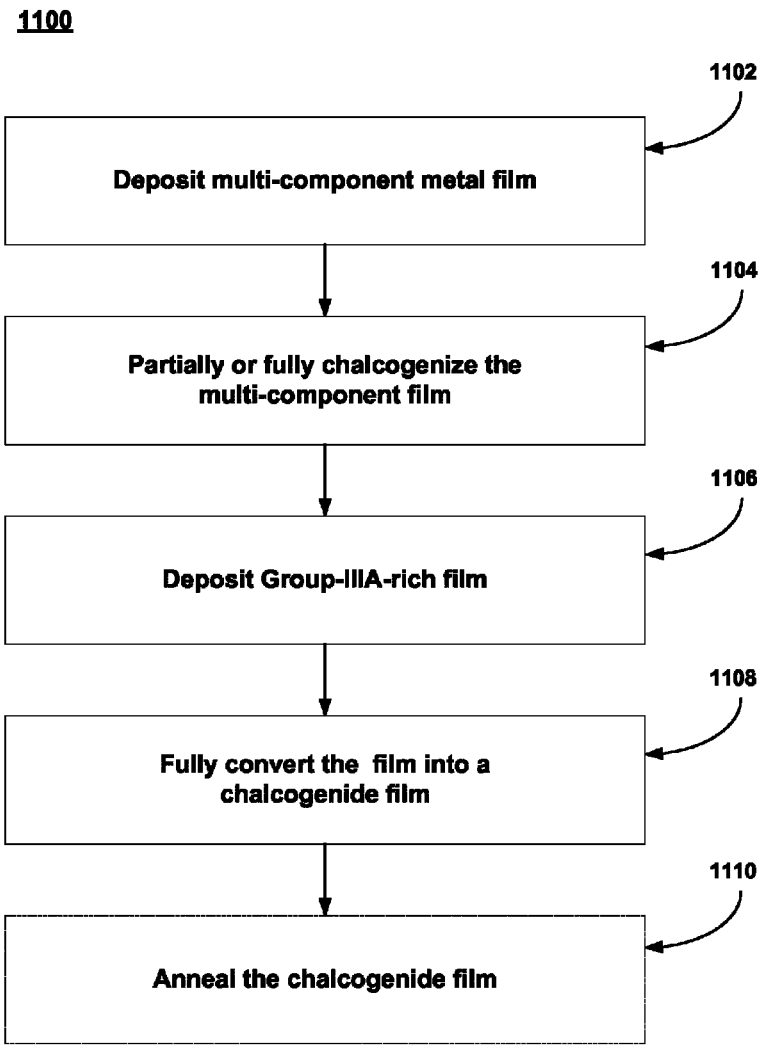
FIG. 11 provides a flow chart for a generic 4-step process.

A second way of grading CIGS (or CZTS) materials is by a 4-step approach as illustrated in FIG. 11. In step 1102, "metal precursor" films are deposited. For CIGS-like absorbers, the metal precursor films comprise Group IB and Group-IIIA metals. For CZTS-like absorbers, the metal precursor films comprise Group IB, Group-IIB, and Group-IVA metals. In the case of CIGS absorbers, the metals comprise Cu, In, and Ga, with/without a Na source. This metal precursor film needs to be converted to a chalcogenide to form the absorber layer. The metal precursor film is converted to a chalcogenide by heating the film in the presence of a source of one or more the Group-VIA elements as indicated in step 1104. In step 1106, a metal-rich layer (e.g. Group IIIA for CIGS-type absorbers, Group IIB for CZTS-type absorbers) is formed on the surface of the partially or fully chalcogenized chalcogenide film. In step 1106, the metal-rich layer may be a metal material or may be a metal chalcogenide material (e.g. metal oxide, metal sulfide, metal selenide, metal telluride, etc.). In step 1108, the entire absorber stack is converted using a chalcogenization process. The chalcogenization process may include an additional anneal step at the end to improve the device performance as illustrated in step 1110. Details of a chalcogenization process including an additional anneal step are described in U.S. patent application Ser. No. 13/283,225, entitled "Method of Fabricating CIGS by Selenization at High Temperatures", filed on Oct. 27, 2011, which is herein incorporated by reference.

Generally, the 4-step method may comprise additional steps when various wet chemical and/or conversion methods (e.g. for densification or contaminant removal) and/or deposition steps are used to form the metal precursor film and/or the metal rich layer. As discussed above, the metal precursor film and/or the metal rich layer may each be a single layer or may each be formed from multiple layers.

In each of the multi-step methods described above and the examples to be disclosed below, the performance of the absorber layer can be improved by incorporating a small amount (i.e. 0.1 atomic %) of Na into the absorber material. The incorporation of Na results in improved film morphology, higher conductivity, and beneficial changes in the defect distribution within the absorber material. The Na may be introduced in a number of ways. The Na may diffuse out of the glass substrate, out of a layer disposed between the glass substrate and the back contact (e.g. a Na containing sol-gel layer formed under the back contact), or out of the back contact (e.g. molybdenum doped with a Na salt). The Na may be introduced from a separate Na containing layer formed on top of the back contact. The Na may be introduced by incorporating a Na source in the Cu(In, Ga) precursor film. Examples of suitable Na sources comprise $Na_2Se$, $Na_2O_2$, NaF, $Na_2S$, etc. The Na may be introduced from a separate Na containing layer formed on top of the Cu(In, Ga) precursor film. The Na may be introduced from a separate Na containing layer formed on top of the partially or completely chalcogenized CIGS film. The Na may be introduced by incorporating a Na source in the Ga-rich film. The Na may be introduced from a separate Na containing layer formed on top of the Ga-rich film. The Na may be introduced by incorporating a Na source during the selenization step. The Na may be introduced after the final chalcogenization step, followed by a heat treatment. The Na may be introduced by combining any of these methods as required to improve the performance of the absorber layer.

In each of the multi-step methods described above and the examples to be disclosed below, a metal precursor film(s) is deposited. Typically, the precursor material will deviate in shape, size, composition, homogeneity, crystallinity, or some combination of these parameters from the absorber material that is ultimately formed as a result of the method. As mentioned previously, the metal precursor film(s) can comprise multiple layers. These layers may be deposited by the same or by different deposition techniques. It should be noted that similar Group IA, and/or Group IIA elements like K, and Ca might be used instead of sodium.

The metal precursor film(s) can be deposited using a number of techniques. Examples comprise dry deposition techniques such as batch or in-line (co)evaporation, batch or in-line PVD (sputtering), ALD, CVD, Plasma enhanced CVD (PECVD), Plasma enhanced ALD (PEALD), atmospheric pressure CVD (APCVD), ultra-fast atmospheric ALD, plating, printing or spraying of inks, screen printing, inkjet printing, slot die coating, gravure printing, wet chemical depositions, etc.

In the discussions of the materials and layers discussed with respect to FIGS. 3-5, typical deposition methods were listed for each layer. Additionally, in each case, all of the materials discussed above and the methods to follow can be deposited using deposition techniques based on nanopowders, nanoparticles, etc. Nanoparticles are sometimes defined as particles with sizes between 1 nm and 100 nm. As used herein, the term "nanoparticles" will be understood to cover all particle sizes from 1 nm up to 1000 nm. Nanoparticles can be formed from metal, dielectric, or semiconductor materials as well as hybrid structures wherein the core of the nanoparticles is different from an outer shell of the nanoparticles. The formation of nanoparticles is well understood.

Nanoparticles may be delivered in a wide variety of delivery systems such as liquids, inks, pastes, sol-gels, colloids, etc. Further, they may be applied using common techniques such as spin coating, dipping, spraying, ink-jet printing, screen printing, roller coating, casting, curtain coating, slot die coating, capillary coating, etc. The benefit of these techniques is that they are scalable to large area substrates, are scalable to high volume manufacturing, have acceptable material utilization rates, and are inexpensive. Generally, the nanoparticle solution or paste must be heated to evaporate the carrier medium. Additionally, the resulting nanoparticles film may be annealed or otherwise treated to influence properties such as density, conductivity, reflectivity, roughness, etc.

Other examples of deposition techniques also comprise wet deposition techniques wherein the metal precursor materials are delivered using a liquid vehicle or carrier. The liquid vehicle (e.g. solvent, solvent mixture, and/or water) contains the metal precursor material in the form of particles, nanoparticles, nanocolloids, nanoflakes, microflakes, spherical and/or non-spherical particles, dissolved precursor materials, polymeric precursor materials, or combinations thereof. The particles may have a homogeneous composition, an inhomogeneous composition, or may have a shell comprising a different composition from the core of the particle. Various types of particles may be combined within the same liquid vehicle. The particles may be elemental, binary, or multinary compounds (e.g. metal chalcogenides). The particles may be salts or undissolved polymers with inorganic ionic groups. The particles may be "grown" using various well known wet chemical processes, or may be produced by grinding or milling larger sized particles.

There are many techniques that can be used to deliver the liquid vehicle containing the particles to the substrate. Examples of suitable techniques comprise printing (e.g. ink-jet printing, screen printing, gravure printing, and the like), wet coating (e.g. slot-die coating, curtain coating, capillary coating, roll coating, and the like), and spraying (e.g. ultrasonic spraying, spray pyrolysis, and the like). Advantageously, depositions using these techniques occur at atmospheric pressure and at temperatures between room temperature and 90° C. Additionally, it is advantageous if the depositions using these techniques can be accomplished without the use of electromagnetic sources such as ultraviolet (UV) light and/or electric fields.

Examples of other techniques that can be used to deposit the metal precursor materials comprise ion-layer-gas-reaction (ILGAR), hot liquid metal deposition, sol-gel techniques, metal emulsions, electroplating, electroless plating, chemical bath deposition (CBD), and chemical surface deposition (CSD).

One or more wet chemical surface or film treatments may be used to remove unwanted material, replace unwanted material with wanted material (e.g. by ionic exchange), convert the film or surface, or add material to the film. Advantageously, treatments using these techniques occur at atmospheric pressure and at temperatures between room temperature and 90° C. Additionally, it is advantageous if the treatments using these techniques can be accomplished without the use of electromagnetic sources such as ultraviolet (UV) light and/or electric fields. Examples of wet chemical surface or film treatments comprise KCN-etch, $Br_2$/MeOH etch, partial electrolyte treatments, acid etch, alkaline etch, $NH_3$ treatment, etc.

One or more heat treatments will be required after the deposition of the metal precursor materials using one of the deposition techniques described previously to convert the metal precursor materials into high quality, dense, semiconductor materials. As discussed previously, collectively, these processes will be called chalcogenization, two examples of which are selenization, and sulfurization. Typically, the heat treatment will further require a suitable atmosphere such as $N_2$, $H_2$, CO, $H_2Se$, $H_2S$, $H_2Te$, diethyl selenide (DESe), diethyl telluride (DETe), Se, S, Te, or combinations thereof. The contaminants inherently present in inks or liquid vehicle formulations might be partially or fully removed by atmospheric plasma glow discharge treatments, UV-ozone treatments, laser treatments, treatments with weak (in)organic acids, etc.

The most common conversion method involves subjecting the metal precursor materials to a chalcogenization process wherein the metal precursor materials are converted to chalcogenide materials. The substrate and the metal precursor materials are heated in the presence of a suitable chalcogen source (e.g. $H_2Se$, $H_2S$, $H_2Te$, diethyl selenide (DESe), diethyl telluride (DETe), Se, S, Te, or combinations thereof, etc.) in an atmosphere with a low $O_2$ and/or low $H_2O$ content. The atmosphere typically comprises inert gases such as $N_2$ and/or Ar. Alternatively, the chalcogen (i.e. Se, S, Te) may be deposited as a solid (either elemental or as a suitable compound) on the surface of the metal precursor materials prior to the heat treatment. The chalcogen solid may be deposited using a vacuum process, an atmospheric process, a printing process, a wet coating process, other solution based processes, or some combination thereof.

Any suitable heat treating technique may be used during the conversion process. Examples comprise convective heating, conductive heating, radiative heating, or combinations thereof. Furthermore, common heating methods comprise infra-red (IR) lamps, resistive heating, muffle heating, strip heating, laser heating, flash lamps, etc.

The conversion process may be performed in a batch system or an in-line system. In the case of an in-line system, the substrate may move through the system in a continuous manner or may move through the system in a "stop-and-soak" manner, wherein the substrate moves through various process regions of the system in a step-wise manner.

Figure 12:
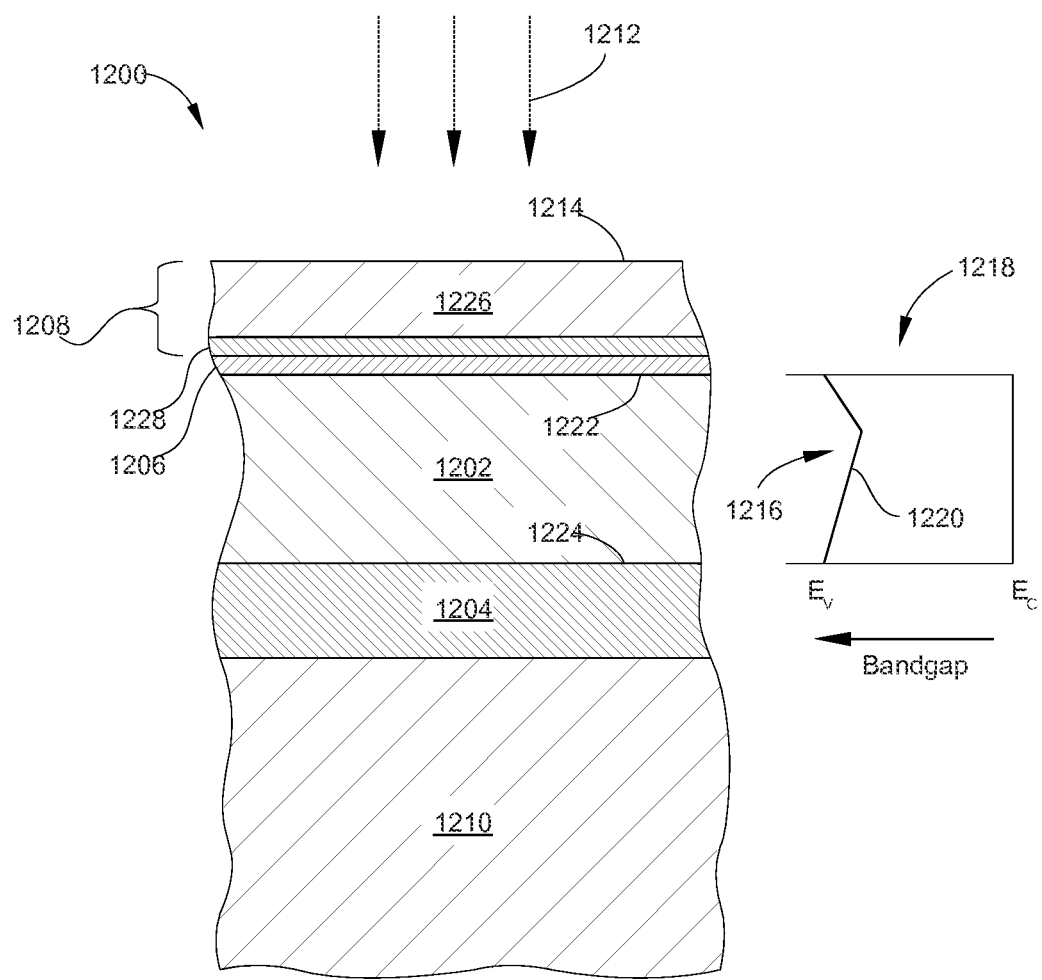
FIG. 12 is a schematic cross-sectional view of a thin film photovoltaic device with a copper-indium-gallium-selenide (CIGS) absorber layer, configured according to embodiments of the invention.

FIG. 12 is a schematic cross-sectional view of a TFPV device 1200 with a CIGS absorber layer 1202, configured according to some embodiments of the present invention. TFPV device 1200 includes a back contact layer 1204, CIGS absorber layer 1202, a buffer layer 1206, and a TCO stack 1208, arranged as shown on a substrate 1210 to form a TFPV device stack. Light 1212 is incident on a front surface 1214 of TFPV device 1200, passes through TCO stack 1208 and buffer layer 1206, and is absorbed by CIGS absorber layer 1202 and converted to electrical energy.

Substrate 1210 may be a rigid or flexible substrate. Examples of rigid substrates suitable for use as substrate 1210 include float glass, low-iron glass, borosilicate glass, specialty glass for high temperature processing, stainless steel, carbon steel, aluminum, copper, titanium, molybdenum, plastics, etc. Examples of flexible substrates suitable for use as substrate 1210 include polyimide, flexible glass, cladded metal foils, etc.

Back contact layer 1204 serves as the primary current conductor layer of TFPV device 1200 and is also configured to reflect most unabsorbed light back into CIGS absorber layer 1202. In some embodiments, back contact layer 1204 comprises a molybdenum (Mo) layer that has a thickness between 0.3 microns and 1.0 microns. In addition to high reflectivity, it is desirable for back contact layer 1204 to have relatively high electrical conductivity, good ohmic contact to CIGS absorber layer 1202, ease of bonding to tabs for external connectivity, ease of scribing or other removal, good thermo-mechanical stability, and chemical resistance during subsequent processing, among properties. Back contact layer 1204 may be formed by any number of deposition technologies, including physical vapor deposition PVD (sputtering), evaporation, CVD, ALD, plating, etc.

CIGS absorber layer 1202 is a p-type absorber layer having a thickness of between 1.0 micron and 4.0 microns and includes a CIGS material formed according to some embodiments of the invention. Specifically, CIGS absorber layer 1202 has a double-graded bandgap profile 1216, which is illustrated schematically in bandgap profile diagram 1218 shown in FIG. 12. For clarity, bandgap profile diagram 1218 is disposed adjacent to and aligned with CIGS absorber layer 1202 to better illustrate the change in the bandgap value 1220 of CIGS absorber layer 1202 with respect to a light-receiving surface 1222 and a back contact surface 1224 of CIGS absorber layer 1202. Bandgap value 1220 represents the energy difference between the top of the valence band and the bottom of the conduction band in CIGS absorber layer 1202. As shown in bandgap profile diagram 1218, bandgap profile 1216 is "double-graded," i.e., the bandgap value 1220 increases toward light-receiving surface 1222 and also toward back contact surface 1224, with a bandgap minimum located in a center region of the CIGS absorber layer 1202. Because bandgap value 1220 increases at light-receiving surface 1222, the generation of carriers near light-receiving surface 1222 is discouraged, thereby advantageously reducing recombination. Because bandgap value 1220 increases at back contact surface 1224, a back surface field is created, which reduces recombination at back contact surface 1224 and enhances carrier collection. Bandgap profile 1216 is double-graded since the concentration of gallium in CIGS absorber layer 1202 is also double-graded, with an increased concentration of gallium at light-receiving surface 1222 and also at back contact surface 1224.

According to some embodiments, CIGS absorber layer 1202 is formed on back contact layer 1204 in a two-step process that does not include sulfur incorporation. It is noted that embodiments of the invention produce a double-graded concentration of gallium in CIGS absorber layer 1202 so that CIGS absorber layer 1202 has a double-graded bandgap profile 1216, as illustrated in bandgap profile diagram 1218. First, a precursor film that includes copper, indium, and gallium is deposited on back contact layer 1204, with sputtering, evaporation, electroplating, solution-based synthesis, or other metal deposition processes known in the art. For example, a co-sputtering process may be performed using binary copper-gallium and indium sputter targets. The copper-indium-gallium precursor film may comprise multiple layers or a single layer, and may be a dense or porous film. Subsequent to deposition of the copper-indium-gallium precursor film, one of several possible embodiments of the invention is used to form CIGS absorber layer 1202 with a double-graded concentration of gallium, so that CIGS absorber layer 1202 has double-graded bandgap profile 1216.

In some embodiments, a $Ga_xSe_y$ layer is formed on the copper-indium-gallium precursor film using trimethyl gallium (TMGa) gas and a selenium (Se) containing gas in an initial, low-temperature selenization process, in which the selenium-containing gas used in the selenization process does not react with the copper-indium-gallium precursor film. A subsequent high-temperature selenization process forms the typical gallium-rich region at back contact surface 1224 of CIGS absorber layer 1202 while simultaneously converting the deposited $Ga_xSe_y$ layer to a gallium-rich region at light-receiving surface 1222 of CIGS absorber layer 1202. The embodiment is described in greater detail below in conjunction with FIG. 13 and FIGS. 14A-C.

In some embodiments, the copper-indium-gallium precursor film first undergoes a conventional selenization process to form a CIGS absorber layer that has the typical gallium-rich region at back contact surface 1224 and therefore has a single-graded bandgap profile. Then, using TMGa and a selenium-containing gas, a $Ga_xSe_y$ layer is formed on light-receiving surface 1222 of the single-graded CIGS absorber layer, and a subsequent anneal process converts the deposited $Ga_xSe_y$ to a gallium-rich region at the front surface of the absorber. The embodiment is described in greater detail below in conjunction with FIG. 15 and FIGS. 16A-D.

In some embodiments, the copper-indium-gallium precursor film first undergoes a conventional partial or complete selenization process to form a CIGS absorber layer that has the typical gallium-rich region at back contact surface 1224 and a single-graded bandgap profile. Then, thermal pyrolysis of TMGa is used to deposit a gallium layer on light-receiving surface 1222 of the single-graded CIGS absorber layer, and a subsequent selenization process forms a $Ga_xSe_y$ layer from the deposited gallium. Depending on the temperature of the selenization process, an anneal process may be used in a final step to convert the $Ga_xSe_y$ layer to a gallium-rich region at light-receiving surface 1222 of CIGS absorber layer 1202. The embodiment is described in greater detail below in conjunction with FIG. 17 and FIGS. 18A-E.

Buffer layer 1206 of TFPV device 1200 is an n-type buffer layer deposited on CIGS absorber layer 1202. In some embodiments, buffer layer 1206 comprises a cadmium sulfide (CdS) layer that has a thickness between 30 nm and 100 nm. Other n-type buffer layer materials suitable for use in buffer layer 1206 include ZnS, $In_2S_3$, $In_2(S,Se)_3$, CdZnS, ZnO, Zn(O,S), (Zn,Mg)O, etc. Buffer layer 1206 may be deposited using chemical bath deposition (CBD), chemical surface deposition (CSD), PVD, printing, plating, ALD, ion-layer-gas-reaction (ILGAR), or evaporation.

TCO stack 1208 serves as part of the front contact structure of TFPV device 1200 and is formed from transparent conductive metal oxide materials. TCO stack 1208 collects charge across the face of TFPV device 1200 and conducts the charge to tabs used to connect TFPV device 1200 to external loads. TCO stack 1208 includes a low resistivity top TCO layer 1226 and an optional intrinsic zinc oxide (iZnO) layer 1228. Optional intrinsic zinc oxide layer 1228 is a high resistivity material that has been found to reduce sensitivity of TFPV device to lateral non-uniformities caused by differences in composition or defect concentration in the absorber and/or buffer layers. Optional intrinsic zinc oxide layer 1228 is formed on CIGS absorber layer 1202 and is generally between 40 to 60 nm in thickness, but in some embodiments is up to 150 nm in thickness. Optional intrinsic zinc oxide layer 1228 is typically formed using deposition processes well-known in the art, including reactive PVD, CVD, plating, or printing. Low resistivity top TCO layer 1226 is formed on optional intrinsic zinc oxide layer 1228, and typically has a thickness between 100 nm and 1 micron. Suitable materials for low resistivity top TCO layer 1226 include aluminum-doped zinc oxide (Al:ZnO), indium tin oxide (InSnO or ITO), indium zinc oxide (InZnO), boron-doped zinc oxide (B:ZnO), gallium-doped zinc oxide (Ga:ZnO), fluorine-doped zinc-oxide (F:ZnO), fluorine-doped tin oxide (F:$SnO_2$), etc. Suitable processes for forming low resistivity top TCO layer 1226 include reactive PVD, CVD, printing or wet-coating from nano-wires or carbon nanotubes, and the like.

Figure 13:
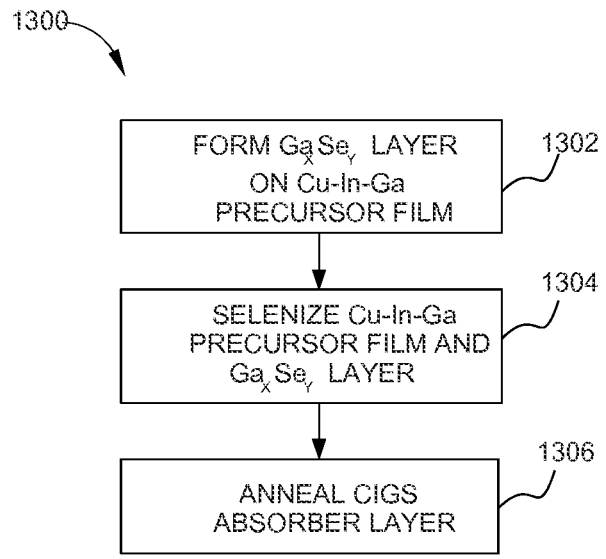
FIG. 13 sets forth a flowchart of method steps in a process sequence for forming a CIGS absorber layer, according to embodiments of the invention.

FIG. 13 sets forth a flowchart of method steps in a process sequence 1300 for forming CIGS absorber layer 1202, according to embodiments of the invention. FIGS. 14A-D sequentially illustrate cross-sectional views of TFPV device 1200 during the execution of process sequence 1300, according to embodiments of the invention. Although the method steps are described in conjunction with TFPV device 1200, persons skilled in the art will understand that formation of other TFPV devices using process sequence 1300 is within the scope of the invention. Prior to the first step of method 1300, back contact layer 1204 is deposited on substrate 1210, and a copper-indium-gallium precursor film 1402 is formed on back contact layer 1204 (shown in FIG. 14A). In an exemplary embodiment, copper-indium-gallium precursor film 1402 has a thickness of 200 nm to 1000 nm and a composition range of copper to indium and gallium (i.e. Cu/(In+Ga)) of 0.7 to 0.95 and gallium to gallium and indium of (i.e. Ga/(In+Ga)) of 0.1 to 0.4.

Figure 14A:
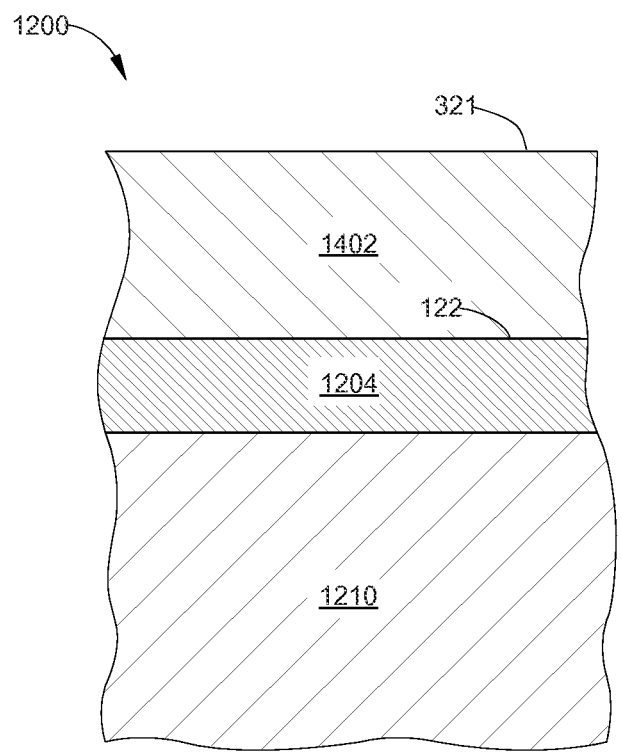
FIGS. 14A-14C sequentially illustrate cross-sectional views of a TFPV device during the execution of the process sequence illustrated in FIG. 13, according to embodiments of the invention.
Figure 14B:
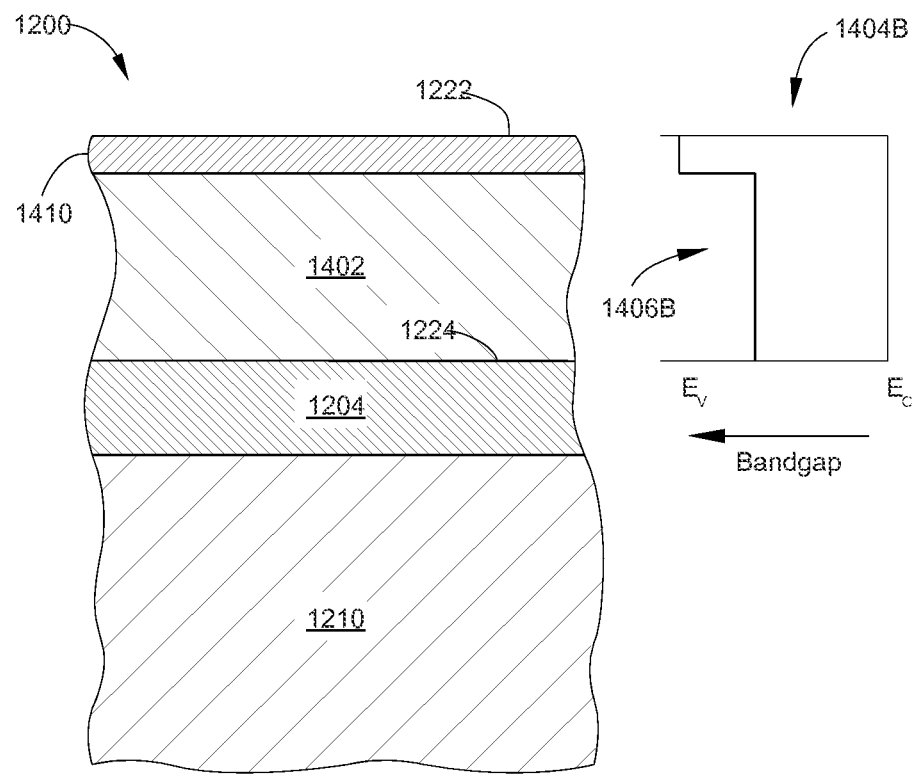

As shown in FIG. 13, method 1300 begins at step 1302, in which the reaction of TMGa vapor with a selenium-containing gas is used to form a $Ga_xSe_y$ layer 1410 on copper-indium-gallium precursor film 1402, (illustrated in FIG. 14B). In addition, the reaction between the TMGa vapor and the selenium-containing gas is performed at a relatively low temperature, so that the selenium-containing gas used in the selenization process does not react with copper-indium-gallium precursor film 1402. In such a selenization process, the temperature of substrate 1210 is maintained below the reaction threshold temperature for the selenization of copper-indium-gallium precursor film 1402, so that $Ga_xSe_y$ layer 1410 is formed on copper-indium-gallium precursor film 1402 as shown in FIG. 14B. Bandgap profile diagram 1404B in FIG. 14B illustrates that bandgap profile 1406B of copper-indium-gallium precursor film 1402 remains substantially constant, since little or no gallium diffuses into copper-indium-gallium precursor film 1402 during step 1302. However, the high concentration of gallium in $Ga_xSe_y$ layer 1410 results in a higher bandgap at light-receiving surface 1222.

Various selenium-containing gases may be used in step 1302 to form $Ga_xSe_y$ layer 1410, including hydrogen selenide ($H_2Se$), selenium vapor (Se), and/or diethylselenide (DESe). In some embodiments, step 1302 takes place in either a batch furnace or an in-line furnace at a deposition temperature between 20° C. and 350° C., and hydrogen selenide is used as the selenium-containing gas. In such an embodiment, $Ga_xSe_y$ layer 1410 is deposited with a thickness of 10 nm to 100 nm using the reaction described in Equation 1:

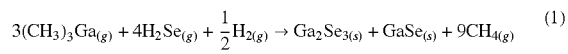

$$3(CH_3)_3Ga_{(g)} + 4H_2Se_{(g)} + \frac{1}{2}H_{2(g)} \rightarrow Ga_2Se_{3(s)} + GaSe_{(s)} + 9CH_{4(g)} \quad (1)$$

Figure 14C:
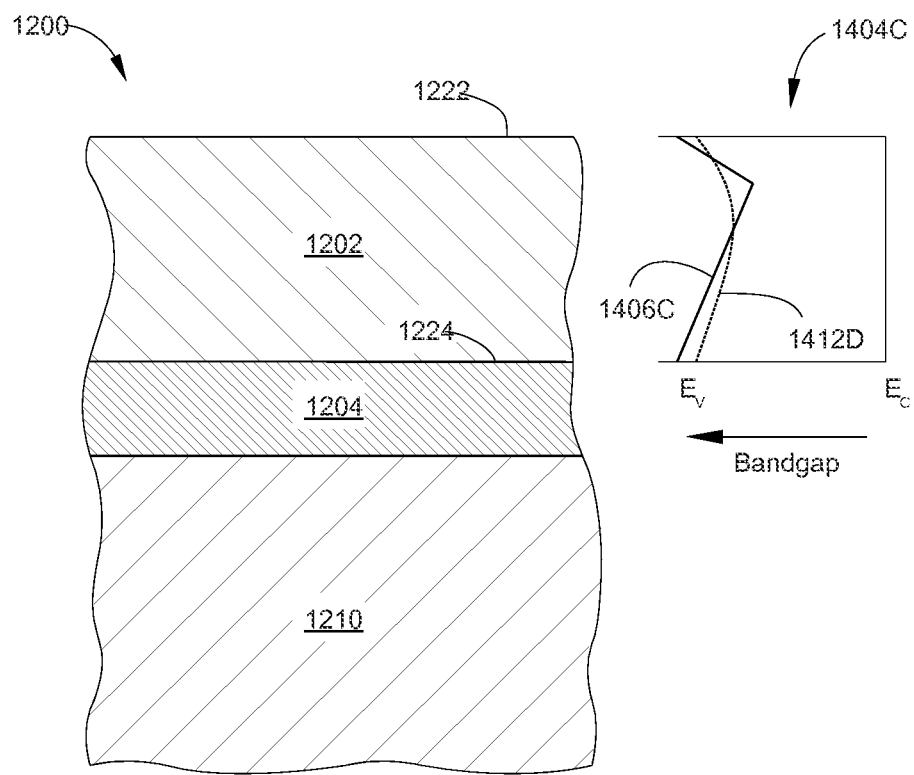

In step 1304, selenization of copper-indium-gallium precursor film 1402 and $Ga_xSe_y$ layer 1410 is performed by reaction with a selenium-containing gas that comprises hydrogen selenide, selenium vapor, diethylselenide, and/or a combination thereof. The selenization process of step 1304 forms CIGS absorber layer 1202 from copper-indium-gallium precursor film 1402 and $Ga_xSe_y$ layer 1410, as shown in FIG. 14C. The reaction with the selenium-containing gas takes place at an elevated temperature (e.g., between 400° C. and 550° C.) so that gallium present in copper-indium-gallium precursor film 1402 reacts with the selenium-containing gas to form a CIGS absorber layer that is gallium-rich at back contact surface 1224. However, at such reaction temperatures, gallium contained in $Ga_xSe_y$ layer 1410 has limited mobility due to the strong Ga—Se bond, and remains concentrated near light-receiving surface 1222 of CIGS absorber layer 1202. Consequently, upon completion of step 1304, CIGS absorber layer 1202 has a double-graded bandgap profile 1406C, as illustrated in bandgap profile diagram 1404C of FIG. 14C.

In some embodiments, the selenium-containing gas comprises hydrogen selenide and the reaction temperature is between 400° C. and 550° C. In some embodiments, the selenium-containing gas comprises selenium vapor and the reaction temperature is between 400° C. and 600° C. It is noted that the processes described for step 1304 may be performed in the same batch furnace or in-line furnace that performs the processes of step 1302. Consequently, implementation of method 1300 is substantially more economical and less complex than processes in which multiple processing chambers are required for the formation of CIGS absorber layer 1202.

In optional step 1306, double-graded bandgap profile 1406C illustrated in FIG. 14C is tuned or optimized in a final anneal process. The anneal process of step 1306 can adjust the Ga distribution in CIGS absorber layer 1202, thereby altering the double-graded bandgap profile 1406C. For example, in some embodiments, the anneal process of step 1306 adjusts double-graded bandgap profile 1406C to a double-graded bandgap profile 1406D. In some embodiments, the anneal process of step 1306 is performed at a temperature greater than or equal to 500° C. It is noted that in some embodiments, depending on the reaction temperature and duration of the selenization process of step 1304, step 1306 may not be necessary. Specifically, in some embodiments, double-graded bandgap profile 1406C may be adjusted to double-graded bandgap profile 1406D during the selenization process of step 1304, i.e., when the selenization process of step 1304 takes place at a sufficiently high temperature and for a sufficiently long duration.

Figure 15:
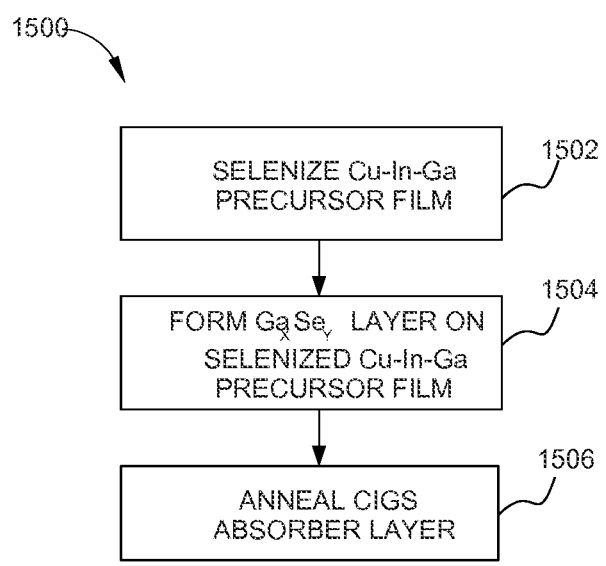
FIG. 15 sets forth a flowchart of method steps in a process sequence for forming a CIGS absorber layer, according to embodiments of the invention.

FIG. 15 sets forth a flowchart of method steps in a process sequence 1500 for forming CIGS absorber layer 1202, according to embodiments of the invention. FIGS. 16A-D sequentially illustrate cross-sectional views of TFPV device 1200 during the execution of process sequence 1500, according to embodiments of the invention. Although the method steps are described in conjunction with TFPV device 1200, persons skilled in the art will understand that formation of other TFPV devices using process sequence 1500 is within the scope of the invention. Prior to the first step of method 1500, back contact layer 1204 and copper-indium-gallium precursor film 1402 are deposited on substrate 1210 as described above in method 1300.

Figure 16A:
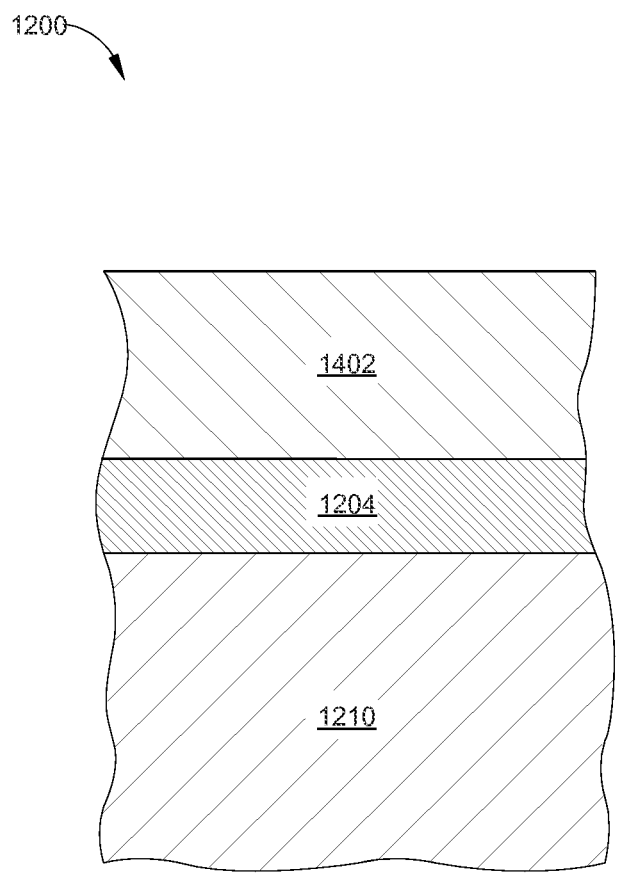
FIGS. 16A-16D sequentially illustrate cross-sectional views of a TFPV device during the execution of the process sequence illustrated in FIG. 15, according to embodiments of the invention.
Figure 16B:
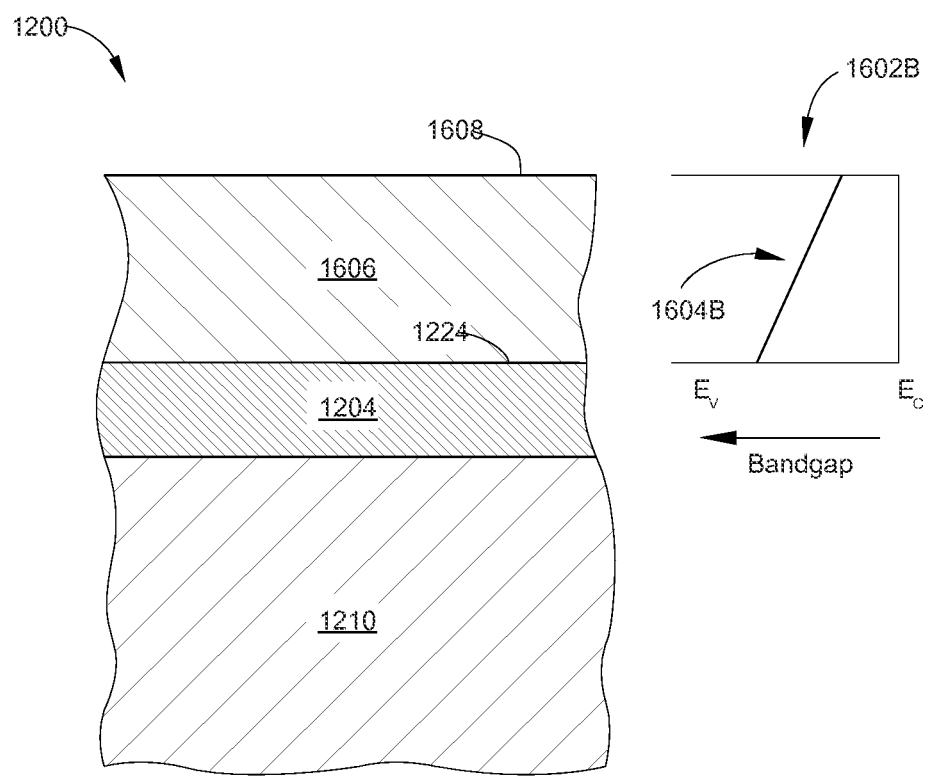

As shown in FIG. 15, method 1500 begins at step 1502, in which a selenization process known in the art is performed on copper-indium-gallium precursor film 1402 to form a CIGS layer 1606, as shown in FIG. 16B. Due to gallium's slower reaction kinetics with selenium compared to indium, gallium accumulates towards back contact surface 1224 of CIGS layer 1606 during the selenization process, so that CIGS layer 1606 has a single-graded bandgap profile that increases from front surface 1608 of CIGS layer 1606 to back contact surface 1224. Bandgap profile diagram 1602B in FIG. 16B illustrates the single-graded bandgap profile 1604B of CIGS layer 1606. Selenization processes suitable for use in step 1502 may be performed in a batch furnace or in-line furnace, are typically carried out in a temperature range of approximately 400° C. to 500° C., and generally use hydrogen selenide and/or selenium vapor.

Figure 16C:
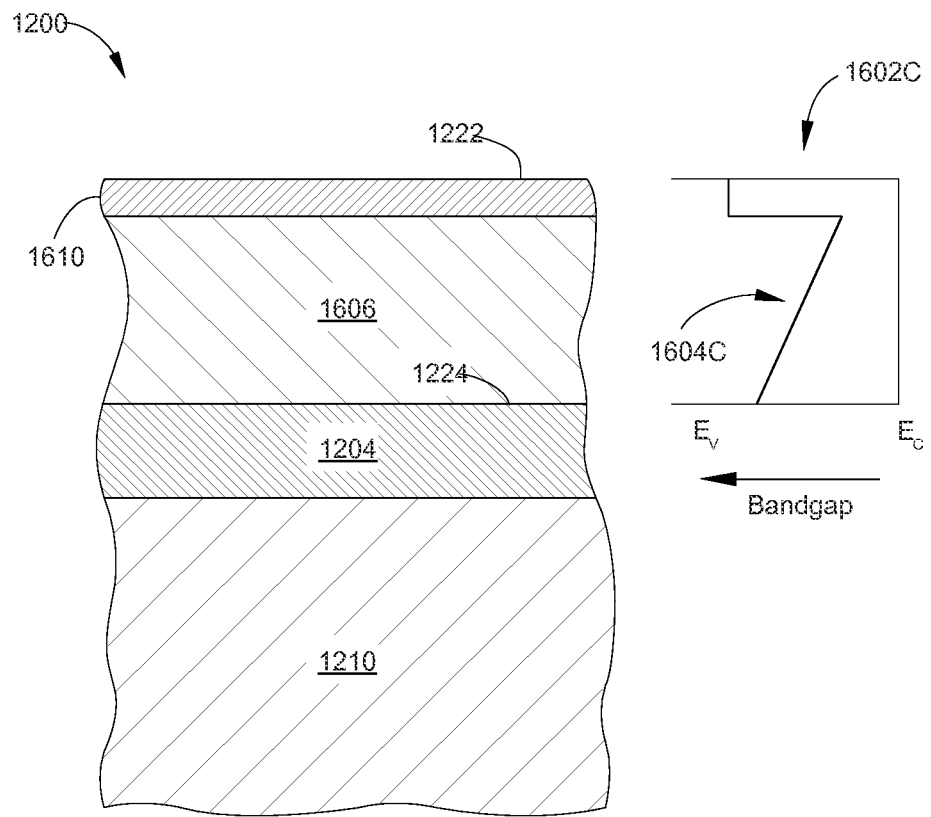

In step 1504, the reaction of TMGa vapor with a selenium-containing gas is used to form a $Ga_xSe_y$ layer 1610 on CIGS layer 1606, illustrated in FIG. 16C. The process of forming $Ga_xSe_y$ layer 1610 on CIGS layer 1606 is similar to the process of forming $Ga_xSe_y$ layer 1410 on copper-indium-gallium precursor film 1402 in step 1302 of method 1300, but differs in one respect. Specifically, the reaction described in Equation 1 can be performed in step 1504 at a higher temperature than in step 1302 of method 1300, e.g., up to 550° C., since CIGS layer 1606 is already chalcogenized in step 1502. As illustrated by bandgap profile diagram 1602C, bandgap profile 1604C of CIGS layer 1606 has a single grade that increases toward back contact surface 1224, while the high concentration of gallium in $Ga_xSe_y$ layer 1610 results in a correspondingly higher bandgap at light-receiving surface 1222. It is noted that the processes described for step 1504 may be performed in the same batch furnace or in-line furnace that performs the processes of step 1502.

Figure 16D:
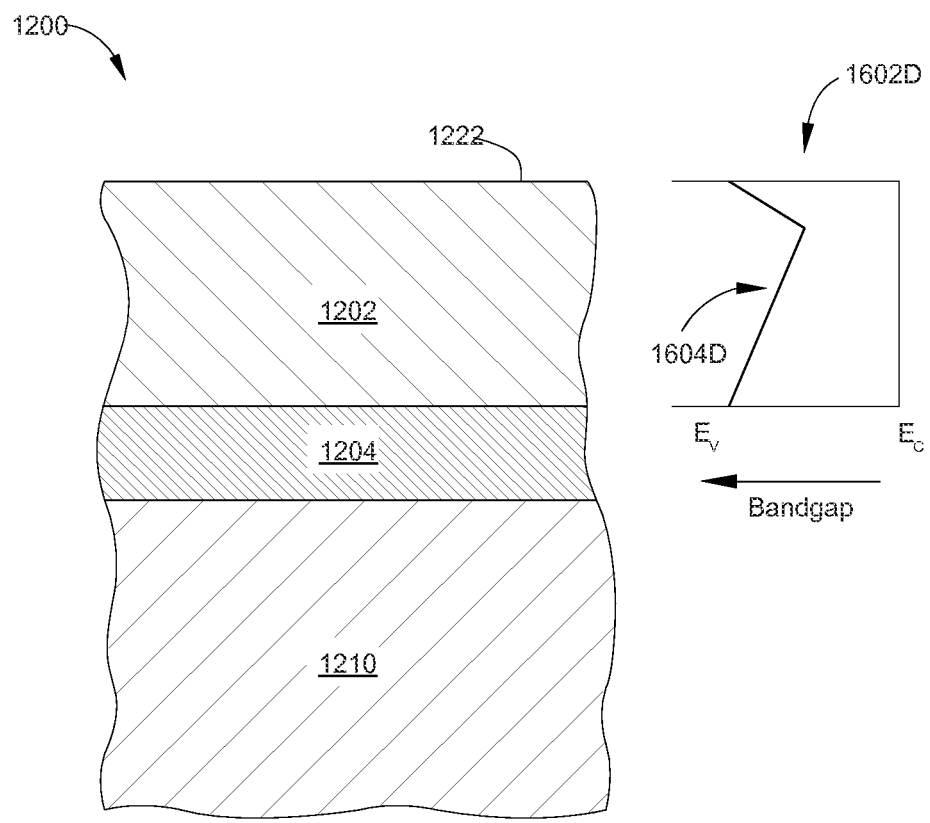

In step 1506, an anneal process is performed on CIGS layer 1606 and $Ga_xSe_y$ layer 1610 to form CIGS absorber layer 1202, as illustrated in FIG. 16D. The anneal process of step 1506 converts $Ga_xSe_y$ layer 1610 into a gallium-rich CIGS region at light-receiving surface 1222, so that the bandgap of CIGS absorber layer 1202 increases at light-receiving surface 1222. Thus, in step 1506, CIGS absorber layer 1202 is formed with a double-graded bandgap profile, as illustrated by bandgap profile 1604D in bandgap profile diagram 1602D. The duration and temperature at which the anneal process of step 1506 takes place may be selected to adjust bandgap profile 1604D as desired. In some embodiments, the anneal process of step 1506 is performed at a temperature between 500° C. and 600° C. It is noted that the anneal process of step 1506 may be performed in the same batch furnace or in-line furnace that performs the processes of steps 1502 and 1504.

Figure 17:
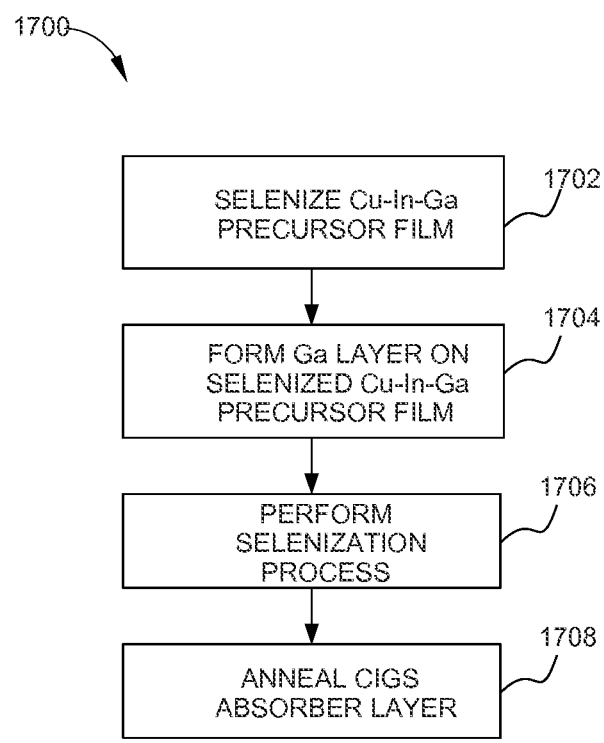
FIG. 17 sets forth a flowchart of method steps in a process sequence 1700 for forming a CIGS absorber layer, according to embodiments of the invention.

FIG. 17 sets forth a flowchart of method steps in a process sequence 1700 for forming CIGS absorber layer 1202, according to embodiments of the invention. FIGS. 18A-D sequentially illustrate cross-sectional views of TFPV device 1200 during the execution of process sequence 1700, according to embodiments of the invention. Although the method steps are described in conjunction with TFPV device 1200, persons skilled in the art will understand that formation of other TFPV devices using process sequence 1700 is within the scope of the invention. Prior to the first step of method 1700, back contact layer 1204 and copper-indium-gallium precursor film 1402 are deposited on substrate 1210 as described above in method 1300.

Figure 18A:
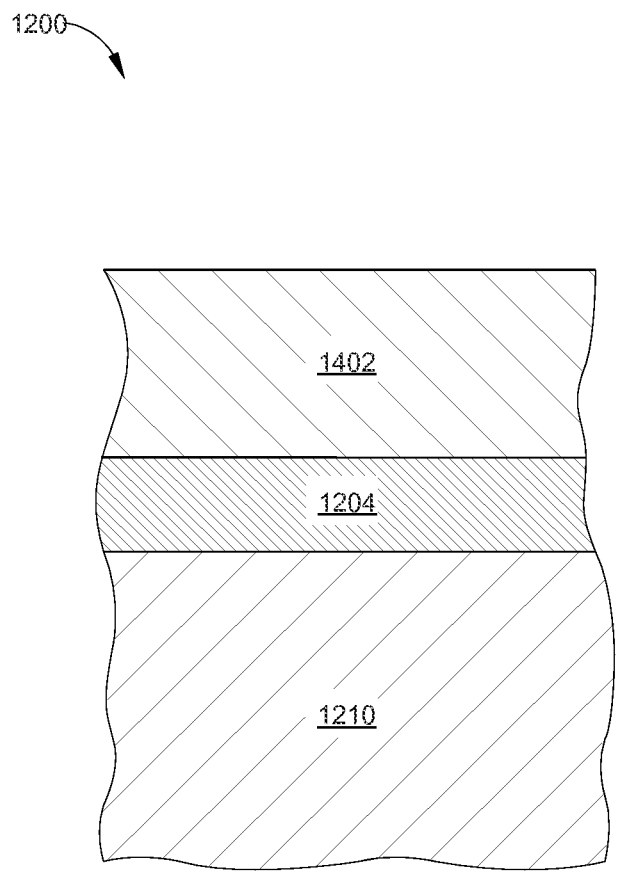
FIGS. 18A-18D sequentially illustrate cross-sectional views of a TFPV device during the execution of the process sequence illustrated in FIG. 17, according to embodiments of the invention.
Figure 18B:
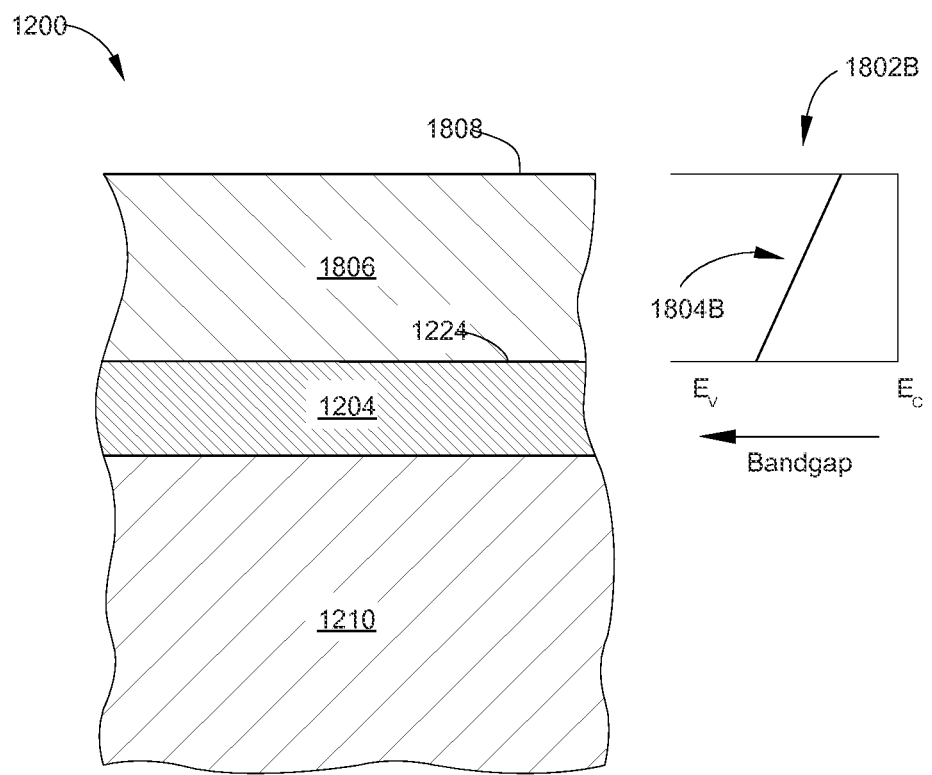

As shown in FIG. 17, method 1700 begins at step 1702, in which a selenization process known in the art is performed on copper-indium-gallium precursor film 1402 to form a CIGS layer 1806, as shown in FIG. 18B. Step 1702 is substantially similar to step 1502 in method 1500, so that CIGS layer 1806 has a single-graded bandgap profile that increases from front surface 1808 of CIGS layer 1806 to back contact surface 1224. Bandgap profile diagram 1802B in FIG. 18B illustrates the single-graded bandgap profile 1804B of CIGS layer 1806.

Figure 18C:
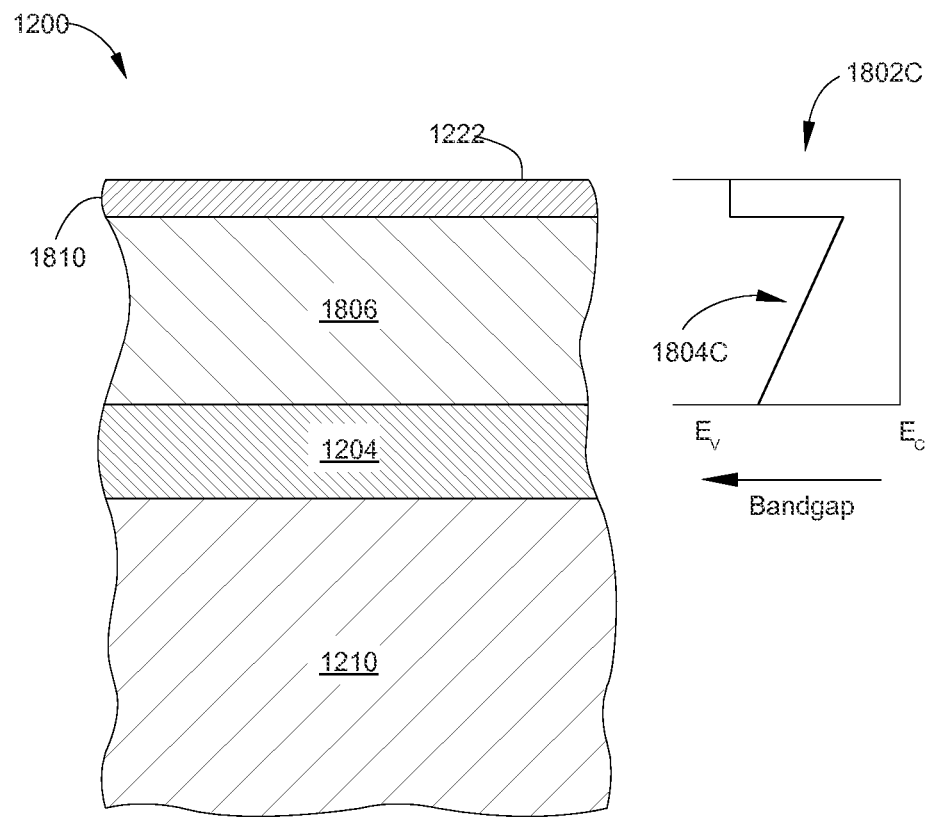
Figure 18D:
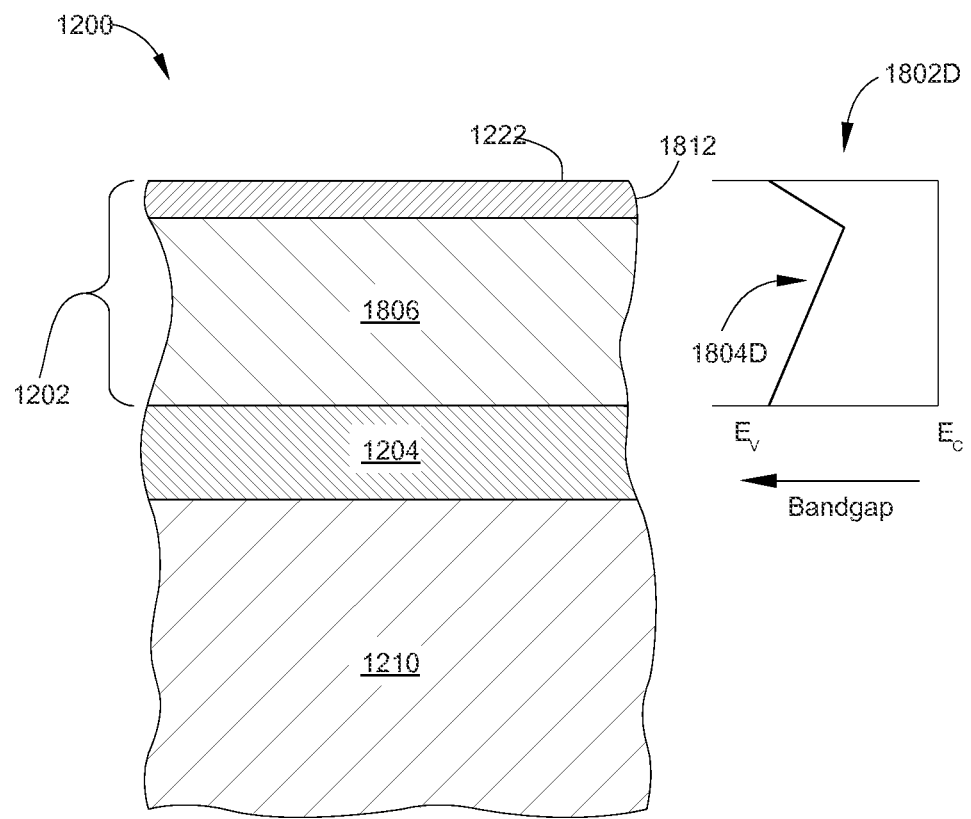

In step 1704, a gallium layer 1810 is formed on CIGS layer 1806, illustrated in FIG. 18C. For visualization purposes, the Gallium layer has been arbitrarily assigned a higher bandgap value. Gallium layer 1810 is formed by exposing CIGS layer 1806 to TMGa vapor at a temperature between 400° C. and 550° C. Thermal pyrolysis of the TMGa vapor results in the deposition of gallium layer 1810. It is noted that the processes described for step 1704 may be performed in the same batch furnace or in-line furnace that performs the processes of step 1702. Bandgap profile diagram 1802C (FIG. 18C) illustrates the single-graded bandgap profile 1804C of CIGS layer 1806 and the high bandgap value at light-receiving surface 1222 associated with gallium layer 1810.

It is noted that the formation of gallium layer 1810 in step 1704 results from the thermal decomposition of TMGa on the exposed surface of copper-indium-gallium precursor film 1402. This is in contrast to the formation of $Ga_xSe_y$ layer 1610 on copper-indium-gallium precursor film 1402, in step 1504 of method 1500, which is a gas-phase reaction that can potentially create unwanted particles the reaction chamber.

In step 1706, a selenization process is performed with a selenium-containing gas. Selenization processes suitable for use in step 1706 may be performed in a batch furnace or in-line furnace, are typically carried out in a temperature range of approximately 400° C. to 550° C., and generally use hydrogen selenide and/or selenium vapor. The selenization process of step 1706 converts gallium layer 1810 to a $Ga_xSe_y$ layer 1812, illustrated in FIG. 18D, and produces the desired double-graded bandgap profile, as illustrated by bandgap profile 1804D in bandgap profile diagram 1802D.

In optional step 1708, an anneal process is performed on CIGS absorber layer 1202. The anneal process of step 1708 may be used to further optimize or adjust the bandgap profile of CIGS absorber layer 1202. In some embodiments, the anneal process in step 1708 is performed at a temperature between 500° C. and 600° C.

It is noted that the processes described for steps 1702-1708 may all be performed in the same batch furnace or in-line furnace. Consequently, implementation of method 1700 is substantially more economical and less complex than processes in which multiple processing chambers are required for the formation of CIGS absorber layer 1202. It is further noted that embodiments of the invention may be performed using any technically feasible deposition techniques known in the art. For example, TFPV device 1200 may be formed using single substrate processing equipment, multiple substrate batch-processing equipment, in-line processing, single chamber processing, roll-to-roll processing, and the like. In-line processing may include continuous processing of substrates while moving through an in-line furnace, or the performance of different processes on each substrate in multiple discrete reaction chambers. Such chambers may be isolated mechanically, by gas curtains, etc.

In some embodiments, Al is used to replace a portion of the Ga in CIGS absorber materials. Aluminum has a number of advantages. The use of Al allows the bandgap to be tuned independent of tuning by Ga (as discussed previously). The use of Al provides a convenient path to the formation of Ga-rich films (i.e. In-poor and/or Cu-poor) through the fabrication of Al—Ga PVD (sputtering) targets with a range of Ga concentrations. Ga and Al form a solid solution up to around 20 weight-% Ga. Finally, Al is more abundant and less expensive than either In or Ga.

Figure 19:
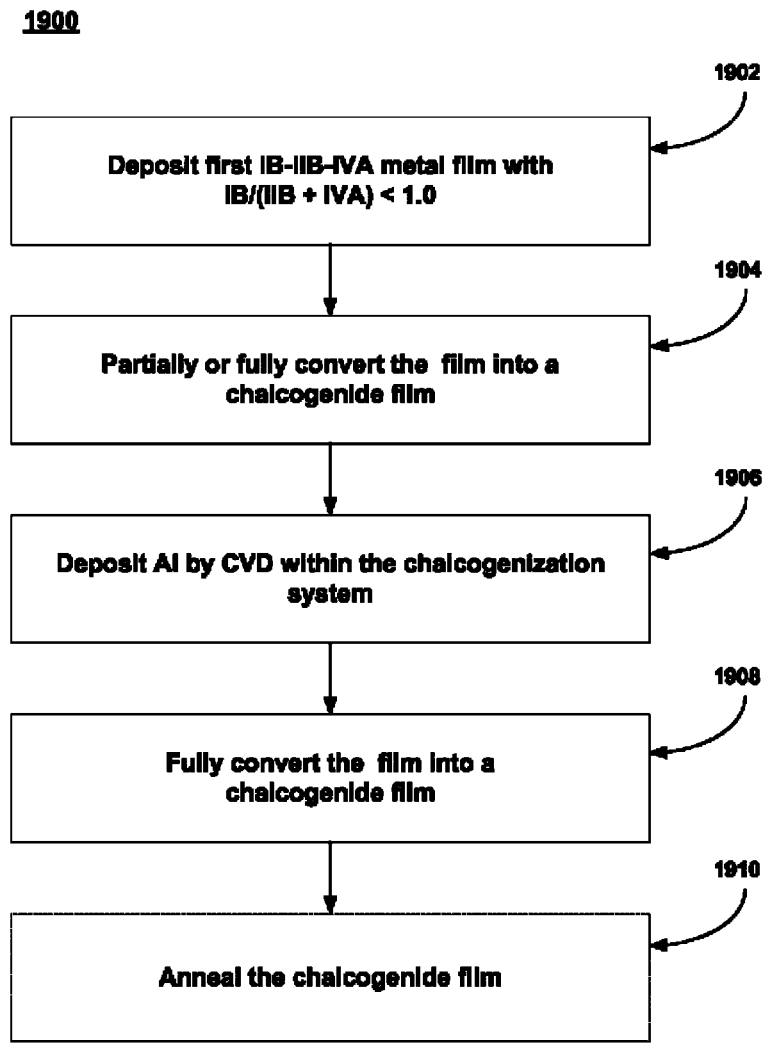
FIG. 19 sets forth a flowchart of method steps in a process sequence for forming a CIGS absorber layer, according to embodiments of the invention.

FIG. 19 illustrates a flow chart for the formation of TFPV absorber materials using a modification of the 2-step process discussed previously. In some embodiments for CIGS-type absorbers, the first metal precursor film may be formed Group-IB-poor (e.g. (Cu)/(IIIA)<1.0, where (IIIA) is the sum of the concentrations of all Group-IIIA elements) as illustrated in step 1902. The Ga concentration as given by Ga/IIIA in the first metal precursor film may be between 0.1 and 0.5. The Group-IB-poor first metal precursor film may exhibit a number of different phases, but may allow a broad range of Group-IB concentrations to be addressed. The first metal precursor film may optionally include Ag as discussed previously. The first metal precursor film may be partially or fully converted to a chalcogenide material in a chalcogenization system as illustrated in step 1904. Typical chalcogenization systems include batch furnaces and in-line furnaces. Advantageously for this method, the chalcogenization system includes batch furnaces. After the conversion in step 1904, a thin Al-containing layer is deposited on top of the metal chalcogenide film by CVD within the same chalcogenization system as illustrated in step 1906. In an in-line system, the Al-containing layer can be deposited in the same reaction chamber as the chalcogenization step or in a separate reaction chamber. There are a number of Al precursors that would be suitable for this CVD step. A few examples are listed here as well as typical deposition temperatures, (in parentheses): trimethylaluminum (>300C), triethylaluminum (>160C), triisobutylaluminum (>250C), diethylaluminum chloride (>340C), dimethylaluminum hydride (>240C), trimethylamine alane (>100C), triethylamine alane (>100C), and trimethylamine aluminaborane (>100), etc. The full stack may then be completely chalcogenized as illustrated in step 1908. Optionally, a final anneal step may be implemented as illustrated in step 1910. This sequence results in an absorber layer with a high Ga concentration at the back contact interface and a high Al concentration at the front interface, resulting in a double gradient bandgap.

FIG. 20 presents a table that summarizes various embodiments and examples of the present invention. Column 1 is a simple identification (ID) used to distinguish the various embodiments in the following discussion. Column 2 presents the final composition of the alloy that forms the absorber layer after the deposition, conversion, and optional annealing steps. Column 3 presents the composition of the first metal precursor film that is deposited. Column 4 presents the composition of the second metal precursor film that is deposited (when applicable). Column 5 presents the grading scheme used in the absorber layer. "Back (BSG)" is back side grading only (i.e. single grading in composition and single grading in bandgap). "Double (DSG)" is double side grading (i.e. double grading in composition and double grading in bandgap). Column 6 presents the grading scheme used at the back contact interface. The key to the legends used in the table are found at the bottom of columns 5 and 6. Column 7 presents the grading scheme (when applicable) used at the front interface.

The embodiments listed for ID=1 and ID=2 in the table in FIG. 20 illustrate cases wherein there is a single composition gradient and therefore, a single gradient in the bandgap.

For ID=1, the final composition of the material used to form the absorber layer includes Cu—In—Ga—Se and the composition gradient is in the Ga composition (i.e. Ga/(Ga+In)), wherein the Ga composition varies between the back surface of the absorber layer and the front surface of the absorber layer. The initial metal precursor film includes Cu—In—Ga and may include multiple films with varying compositions (e.g. varying compositions of Ga) as discussed previously. The absorber layer may include or not include Na incorporated by any of the methods described previously. As discussed previously, absorber layers having a single gradient in the bandgap typically exhibit lower efficiency performance than those having a double gradient in the bandgap.

For ID=2, the final composition of the material used to form the absorber layer includes Cu—In—Al—Se and Al has been substituted for Ga in the absorber layer and the composition gradient is in the Al composition (i.e. Al/(Al+In)), wherein the Al composition varies between the back surface of the absorber layer and the front surface of the absorber layer. The initial metal precursor film includes Cu—In—Al and may include multiple films with varying compositions as discussed previously. The absorber layer may include or not include Na incorporated by any of the methods described previously. As discussed previously, absorber layers having a single gradient in the bandgap typically exhibit lower efficiency performance than those having a double gradient in the bandgap.

The embodiments listed for ID=3 through ID=13 in the table in FIG. 20 illustrate cases wherein there is a double composition gradient and therefore, a double gradient in the bandgap.

For ID=3, the composition gradient is in the Ga composition (i.e. Ga/(Ga+In)) and in the S composition (i.e. S/(S+Se)), wherein the Ga and S compositions vary between the back surface of the absorber layer and the front surface of the absorber layer. For ID=3, the Ga composition gradient is positioned toward the back surface of the absorber layer, wherein the S composition gradient is positioned at both the back surface and the front surface of the absorber layer. The S is typically introduced in the chalcogenization step of the process. The initial metal precursor film includes Cu—In—Ga and may include multiple films with varying compositions as discussed previously. The absorber layer may include or not include Na incorporated by any of the methods described previously. As discussed previously, absorber layers having a double gradient in the bandgap typically exhibit higher efficiency performance than those having a single gradient in the bandgap.

For ID=4, the composition gradient is in the Ga composition (i.e. Ga/(Ga+In)) and in the Ag composition (i.e. Ag/(Cu+Ag)), wherein the Ga and Ag compositions vary between the back surface of the absorber layer and the front surface of the absorber layer. For ID=4, the Ga composition gradient is positioned toward both the back surface and the front surface of the absorber layer, wherein the Ag composition gradient is positioned at the front surface of the absorber layer. The initial metal precursor film includes Cu—Ag—In—Ga and may include multiple films with varying compositions as discussed previously. The initial metal precursor film may be deposited in several sequences. In some embodiments, a Ag film is deposited on top of a Cu—In—Ga film. In some embodiments, a Ag—Ga film is deposited on top of a Cu—In—Ga film. In some embodiments, the Ag composition (i.e. Ag/(Cu+Ag)) is varied throughout the film during deposition, with the Ag composition being selected to be high at the front surface of the absorber layer. The absorber layer may include or not include Na incorporated by any of the methods described previously. As discussed previously, absorber layers having a double gradient in the bandgap typically exhibit higher efficiency performance than those having a single gradient in the bandgap.

For ID=5, the composition gradient is in the Ga composition (i.e. Ga/(Ga+In)), wherein the Ga composition varies between the back surface of the absorber layer and the front surface of the absorber layer. For ID=5, the Ga composition gradient is positioned toward both the back surface and the front surface of the absorber layer. The initial metal precursor film includes Cu—In—Ga. For ID=5, the absorber layer may include Na or other alkali metals such as K, Mg, or Ca incorporated by any of the methods described previously. The composition of the Group-IA and/or Group-IIA metal may be varied throughout the depth of the absorber layer. As discussed previously, absorber layers having a double gradient in the bandgap typically exhibit higher efficiency performance than those having a single gradient in the bandgap.

For ID=6, the composition gradient is in various components of the absorber layer, including one or more of Ga, Ag, S, or Te. The various compositions vary between the back surface of the absorber layer and the front surface of the absorber layer. The one or more of S, Se, or Te are typically introduced in the chalcogenization step of the process. The initial metal precursor film includes Cu—Ag—In—Ga and may include multiple films with varying compositions as discussed previously. The absorber layer may include or not include Na incorporated by any of the methods described previously. As discussed previously, absorber layers having a double gradient in the bandgap typically exhibit higher efficiency performance than those having a single gradient in the bandgap.

For ID=7, the composition gradient is in the Ga composition (i.e. Ga/(Ga+In)), wherein the Ga composition varies between the back surface of the absorber layer and the front surface of the absorber layer. For ID=7, the Ga composition gradient is positioned toward both the back surface and the front surface of the absorber layer. The initial metal precursor film includes Cu—In—Ga and one or more of O, S, Se, or Te and may include multiple films with varying compositions as discussed previously. In some embodiments, the initial metal precursor film includes three layers wherein the second layer includes the Group VIA (e.g. O, S, Se, or Te) element. The absorber layer may include or not include Na incorporated by any of the methods described previously. As discussed previously, absorber layers having a double gradient in the bandgap typically exhibit higher efficiency performance than those having a single gradient in the bandgap.

For ID=8, the composition gradient is in the Ga composition (i.e. Ga/(Ga+In)), wherein the Ga composition varies between the back surface of the absorber layer and the front surface of the absorber layer. For ID=8, the Ga composition gradient is positioned toward both the back surface and the front surface of the absorber layer. The initial metal precursor film includes Cu—In—Ga and may include multiple films with varying compositions as discussed previously. A second metal precursor film also includes Cu—In—Ga with a different composition and is deposited after a partial or full chalcogenization of the first precursor film as discussed previously. The absorber layer may include or not include Na incorporated by any of the methods described previously. As discussed previously, absorber layers having a double gradient in the bandgap typically exhibit higher efficiency performance than those having a single gradient in the bandgap.

For ID=9, the composition gradient is in the Ga composition (i.e. Ga/(Ga+In)) and in the Ag composition (i.e. Ag/(Cu+Ag)), wherein the Ga and Ag compositions vary between the back surface of the absorber layer and the front surface of the absorber layer. For ID=9, the Ga composition gradient is positioned toward both the back surface and the front surface of the absorber layer, wherein the Ag composition gradient is positioned at the front surface of the absorber layer. The initial metal precursor film includes Cu—In—Ga and may include multiple films with varying compositions as discussed previously. A second metal precursor film also includes Cu—Ag—In—Ga with a different composition and is deposited after a partial or full chalcogenization of the first precursor film as discussed previously. The absorber layer may include or not include Na incorporated by any of the methods described previously. As discussed previously, absorber layers having a double gradient in the bandgap typically exhibit higher efficiency performance than those having a single gradient in the bandgap.

For ID=10, the composition gradient is in the Ga composition (i.e. Ga/(Ga+In)) and in the composition of other Group-IIIA elements (e.g. In, Al), wherein the Ga and Group-IIIA compositions vary between the back surface of the absorber layer and the front surface of the absorber layer. For ID=10, the Ga composition gradient is positioned toward the back surface of the absorber layer, wherein the Group-IIIA composition gradient is positioned at the front surface of the absorber layer. The initial metal precursor film includes Cu—In—Ga and may include multiple films with varying compositions as discussed previously. A second metal precursor film also includes Cu—In—Ga—Al with a different composition and is deposited after a partial or full chalcogenization of the first precursor film as discussed previously. The absorber layer may include or not include Na incorporated by any of the methods described previously. As discussed previously, absorber layers having a double gradient in the bandgap typically exhibit higher efficiency performance than those having a single gradient in the bandgap.

For ID=11, the composition gradient is in the Ga composition (i.e. Ga/(Ga+In)), wherein the Ga composition varies between the back surface of the absorber layer and the front surface of the absorber layer. For ID=11, the Ga composition gradient is positioned toward both the back surface and the front surface of the absorber layer. The initial metal precursor film includes Cu—In—Ga—Se and may include multiple films with varying compositions as discussed previously. In some embodiments, the initial metal precursor film includes a Cu—In—Ga layer with a Ga—Se layer deposited on top. The absorber layer may include or not include Na incorporated by any of the methods described previously. As discussed previously, absorber layers having a double gradient in the bandgap typically exhibit higher efficiency performance than those having a single gradient in the bandgap.

For ID=12, the composition gradient is in the Ga composition (i.e. Ga/(Ga+In)) and in the Al composition (i.e. Al/(In+Al)), wherein the Ga and Al compositions vary between the back surface of the absorber layer and the front surface of the absorber layer. For ID=12, the Ga composition gradient is positioned toward the back surface of the absorber layer, wherein the Al composition gradient is positioned at both the front surface and the back surface of the absorber layer. The initial metal precursor film includes Cu—In—Ga—Al—Se and may include multiple films with varying compositions as discussed previously. In some embodiments, the initial metal precursor film includes a Cu—In—Ga layer with a Al—Se layer deposited on top. The absorber layer may include or not include Na incorporated by any of the methods described previously. As discussed previously, absorber layers having a double gradient in the bandgap typically exhibit higher efficiency performance than those having a single gradient in the bandgap.

For ID=13, the composition gradient is in the Ga composition (i.e. Ga/(Ga+In)) wherein the Ga composition varies between the back surface of the absorber layer and the front surface of the absorber layer. For ID=13, the Ga composition gradient is positioned both toward the back surface and the front surface of the absorber layer. The initial metal precursor film includes Cu—Ag—In—Ga—Se and may include multiple films with varying compositions as discussed previously. In some embodiments, the initial metal precursor film includes a Cu—In—Ga layer with a Ag—Ga—Se layer deposited on top. The absorber layer may include or not include Na incorporated by any of the methods described previously. As discussed previously, absorber layers having a double gradient in the bandgap typically exhibit higher efficiency performance than those having a single gradient in the bandgap.

Although the foregoing examples have been described in some detail for purposes of clarity of understanding, the invention is not limited to the details provided. There are many alternative ways of implementing the invention. The disclosed examples are illustrative and not restrictive.

What is claimed:

1. A method for forming a semiconductor material on a substrate comprising:
    forming a first metal precursor film above a surface of the substrate, wherein the first metal precursor film comprises Cu, In, and Ga;
    converting at least a portion of the first metal precursor film to a chalcogenide film through heating the first metal precursor film in the presence of a chalcogen at a temperature between 100C and 700C during a first converting step in a reaction chamber;
    forming a second layer above the first metal precursor film, wherein the second layer comprises Al, wherein the second layer is formed while the substrate is within the reaction chamber; and
    converting the first metal precursor film and the second layer to a chalcogenide film through heating the first metal precursor film and the second layer in the presence of a chalcogen at a temperature between 100C and 700C during a second converting step within the reaction chamber.

2. The method of claim 1 wherein the first metal precursor film further comprises Ag.

3. The method of claim 2 wherein a composition of (Cu+Ag) in the first layer as given by (Cu+Ag)/(In+Ga) is less than 1.0.

4. The method of claim 2 wherein a composition of Cu in the first layer as given by Cu/(In+Ga) is less than 1.0.

5. The method of claim 1 wherein a composition of Ga in the first layer as given by Ga/(Ga+In) is between 0.1 and 0.5.

6. The method of claim 1 further comprising annealing the substrate after the second converting step.

7. The method of claim 1 wherein the second layer is formed from an Al CVD precursor comprising at least one of trimethylaluminum, triethylaluminum, triisobutylaluminum, diethylaluminum chloride, dimethylaluminum hydride, trimethylamine alane, triethylamine alane, or trimethylamine aluminaborane.

* * * * *